(12) United States Patent
Zhang

(10) Patent No.: US 11,789,608 B2
(45) Date of Patent: Oct. 17, 2023

(54) KEY STRUCTURE, KEY CONTROL METHOD, AND ELECTRONIC DEVICE

(71) Applicant: VIVO MOBILE COMMUNICATION CO., LTD., Guangdong (CN)

(72) Inventor: Kaiwei Zhang, Guangdong (CN)

(73) Assignee: VIVO MOBILE COMMUNICATION CO., LTD., Guangdong (CN)

(*) Notice: Subject to any disclaimer, the term of this patent is extended or adjusted under 35 U.S.C. 154(b) by 0 days.

(21) Appl. No.: 17/658,420

(22) Filed: Apr. 7, 2022

(65) Prior Publication Data
US 2022/0229549 A1 Jul. 21, 2022

Related U.S. Application Data

(63) Continuation of application No. PCT/CN2020/119892, filed on Oct. 9, 2020.

(30) Foreign Application Priority Data

Oct. 9, 2019 (CN) .......................... 201910952081.8

(51) Int. Cl.
*G06F 3/041* (2006.01)
*G06F 3/044* (2006.01)
(Continued)

(52) U.S. Cl.
CPC ........ *G06F 3/04886* (2013.01); *G06F 3/0412* (2013.01); *G06F 3/0414* (2013.01);
(Continued)

(58) Field of Classification Search
CPC . G06F 3/02; G06F 3/04; G06F 1/1652; G06F 1/1671; G06F 1/3215;
(Continued)

(56) References Cited

U.S. PATENT DOCUMENTS

2007/0030250 A1* 2/2007 Ozaki .................. G06F 3/0412
345/169
2009/0097145 A1* 4/2009 Fujii ..................... G02B 5/286
359/885
(Continued)

FOREIGN PATENT DOCUMENTS

CN 102446016 A 5/2012
CN 102629165 A 8/2012
(Continued)

OTHER PUBLICATIONS

European Search Report and Opinion for European Application No. 20875458, dated Oct. 28, 2022, 02 pages.
(Continued)

*Primary Examiner* — Ryan A Lubit
(74) *Attorney, Agent, or Firm* — TraskBritt

(57) ABSTRACT

The disclosure provides a key structure applied to an electronic device the electronic device includes an OLED screen and an under-screen unit, a through-hole is provided at a preset position of the under-screen unit, and the key structure includes: a light-shielding unit disposed on a side that is of the under-screen unit and facing back from the OLED screen, and fixedly connected to the under-screen unit, the light-shielding unit contains an accommodation space with a notch, and the notch is in communication with the through-hole; a light-emitting unit disposed in the accommodation space; an optical unit disposed in the accommodation space and located between the OLED screen and the light-emitting unit, wherein light emitted by the light-emitting unit forms a preset key pattern on the OLED screen after passing through the optical unit; and a sensing unit located on one side of the light-shielding unit.

20 Claims, 18 Drawing Sheets

(51) Int. Cl.
*G06F 3/04886* (2022.01)
*H10K 50/858* (2023.01)
*H10K 59/126* (2023.01)

(52) U.S. Cl.
CPC ......... *G06F 3/0447* (2019.05); *H10K 50/858* (2023.02); *H10K 59/126* (2023.02)

(58) Field of Classification Search
CPC .... G06F 1/3231; G06F 1/3262; G06F 1/3265; G06F 1/3293; H10K 50/858; H10K 59/126; H10K 59/40; H10K 2217/9651; H10K 2217/9653; H03K 17/975; H03K 2217/9655; H03K 2217/9656; H04M 1/236
See application file for complete search history.

(56) References Cited

U.S. PATENT DOCUMENTS

| | | | |
|---|---|---|---|
| 2011/0109594 A1* | 5/2011 | Marcus | G06F 3/0393 345/173 |
| 2011/0216025 A1* | 9/2011 | Kurita | G06F 3/016 345/173 |
| 2013/0044058 A1* | 2/2013 | Sciulli | G06F 3/02 345/173 |
| 2013/0044075 A1* | 2/2013 | Utsugi | G06F 3/041 345/174 |
| 2013/0069888 A1* | 3/2013 | Cho | G06F 1/3265 345/173 |
| 2015/0279313 A1* | 10/2015 | Yasuda | G06F 1/3209 345/2.3 |
| 2017/0192140 A1* | 7/2017 | Yoon | G09G 3/03 |
| 2017/0308732 A1* | 10/2017 | Wang | G06F 3/04886 |
| 2018/0164939 A1* | 6/2018 | Duan | G06F 3/048 |
| 2019/0205603 A1* | 7/2019 | Lee | G06V 40/1306 |
| 2020/0218920 A1 | 7/2020 | Guo | |

FOREIGN PATENT DOCUMENTS

| | | | |
|---|---|---|---|
| CN | 103037085 | A | 4/2013 |
| CN | 103458073 | A | 12/2013 |
| CN | 104599598 | A * | 5/2015 |
| CN | 104599598 | A | 5/2015 |
| CN | 106325661 | A | 1/2017 |
| CN | 106775356 | A | 5/2017 |
| CN | 107168631 | A | 9/2017 |
| CN | 107679486 | A | 2/2018 |
| CN | 107800829 | A | 3/2018 |
| CN | 207213752 | U | 4/2018 |
| CN | 108008867 | A | 5/2018 |
| CN | 108363533 | A | 8/2018 |
| CN | 109154959 | A | 1/2019 |
| CN | 109581740 | A | 4/2019 |
| CN | 109710150 | A | 5/2019 |
| CN | 109729200 | A | 5/2019 |
| CN | 109761610 | A | 5/2019 |
| CN | 109934052 | A | 6/2019 |
| CN | 110780746 | A | 2/2020 |
| ES | 1140707 | U | 7/2015 |
| WO | 2018/149705 | A | 8/2018 |

OTHER PUBLICATIONS

Japanese Office Action from Japan Application No. 2022-521544, dated Mar. 22, 2023, 6 pages.
Chinese Office Action and Search Report from Chinese Application No. 201910952081.8, dated Mar. 2, 2021, 30 pages.
International Search Report from International Application No. PCT/CN2020/119892, dated Jan. 14, 2021, 8 pages.
International Written Opinion from International Application No. PCT/CN2020/119892, dated Jan. 14, 2021, 4 pages.

* cited by examiner

KEY STRUCTURE, KEY CONTROL METHOD, AND ELECTRONIC DEVICE

CROSS-REFERENCE TO RELATED APPLICATIONS

Pursuant to 35 U.S.C. § 111(a), this application is a continuation of International Patent Application PCT/CN2020/119892, filed Oct. 9, 2020, which claims the benefit of the People's Republic of China Patent Application Serial No. 201910952081.8, filed Oct. 9, 2019, the disclosure of each of which is hereby incorporated herein in its entirety by this reference.

TECHNICAL FIELD

The present disclosure relates to the technical field of electronic devices, and, in particular, to a key structure, a key control method, and an electronic device.

BACKGROUND

Currently, conventional lateral mechanical keys on an electronic device have been adopted all along by virtue of simplicity and reliability. However, the design of the lateral mechanical keys limits the application of a large-area curved lateral side and a foldable lateral side.

In addition, the mechanical keys of some electronic devices are disposed in a very narrow middle frame, and some electronic devices have a pressure key disposed in the very narrow middle frame of the lateral side. However, in such solutions, a physical protruding position or a conspicuous mark is required to indicate a key region to a user.

On the one hand, the design of physical keys affects appearance integrity of the lateral side of a mobile phone. On the other hand, the experience of pressing a key is inferior because the key in the middle frame of the lateral side is relatively narrow.

In addition, with the development of flexible organic light-emitting diode (Organic Light-Emitting Diode, OLED) screen technology, flexible screens are more often used in electronic devices, as shown in FIG. 1 (a denotes an electronic device, and b denotes a flexible screen). An electronic device equipped with a flexible OLED curved screen can achieve a relatively high screen-to-body ratio and improve aesthetic design and users' visual experience. In a foldable-screen phone, as wrapped by a flexible screen, a lateral foldable region is impracticable for accommodating a physical mechanical key.

As can be seen from above, the key disposed on the electronic device in the prior art affects the increase of the screen-to-body ratio and aesthetics of the electronic device.

BRIEF SUMMARY

The present disclosure is to provide a key structure, a key control method, and an electronic device.

According to a first aspect of the present disclosure, a key structure, applied to an electronic device is provided. The electronic device includes an organic light-emitting diode (OLED) screen and an under-screen unit disposed on a first side of the OLED screen. A through-hole is provided at a preset position of the under-screen unit. The key structure includes:

a light-shielding unit, disposed on a side that is of the under-screen unit and that faces back from the OLED screen, where the light-shielding unit is fixedly connected to the under-screen unit, the light-shielding unit contains an accommodation space with a notch, and the notch is in communication with the through-hole;

a light-emitting unit, disposed in the accommodation space;

an optical unit, disposed in the accommodation space, and located between the OLED screen and the light-emitting unit, where light emitted by the light-emitting unit forms a preset key pattern on the OLED screen after passing through the optical unit; and a sensing unit, located on one side of the light-shielding unit.

According to a second aspect of the present disclosure, an electronic device is provided. The electronic device includes the key structure described above.

According to a third aspect of the present disclosure, a key control method, applied to the electronic device described above is provided. The control method includes:

turning on the light-emitting unit based on first preset information, where the light emitted by the light-emitting unit forms the preset key pattern on the OLED screen;

receiving a touch operation specific to the preset key pattern by using the sensing unit; and performing a preset operation in response to the touch operation, where, the first preset information includes first indication information corresponding to the key structure, and/or, the first preset information includes first time information for controlling the light-emitting unit to emit light.

According to a fourth aspect of the present disclosure, an electronic device is provided. The electronic device includes the key structure described above.

The electronic device further includes:

a first processing module, configured to turn on the light-emitting unit based on first preset information, where the light emitted by the light-emitting unit forms the preset key pattern on the OLED screen;

a first receiving module, configured to receive a touch operation specific to the preset key pattern by using the sensing unit; and a first performing module, configured to perform a preset operation in response to the touch operation, where, the first preset information includes first indication information corresponding to the key structure, and/or, the first preset information includes first time information for controlling the light-emitting unit to emit light.

According to a fifth aspect of the present disclosure, an electronic device is provided, which includes a processor, a memory, and a computer program stored in the memory and executable by the processor. When executed by the processor, the computer program implements steps of the key control method described above.

According to a sixth aspect of the present disclosure, a computer-readable storage medium is provided. The computer-readable storage medium stores a computer program. When executed by a processor, the computer program implements steps of the key control method described above.

According to a seventh aspect of the present disclosure, a computer program is provided. The computer program is stored in a non-volatile storage medium. The computer program is configured to be executed by at least one processor to implement steps of the key control method described above.

According to an eighth aspect of the present disclosure, a control device is provided. The control device is configured to implement the key control method described above.

According to a ninth aspect of the present disclosure, a chip is provided. The chip includes a processor and a communication interface. The communication interface is coupled to the processor. The processor is configured to run a program or instructions to implement the key control method described above.

In the embodiments of the present disclosure, it is configured that the electronic device includes an organic light-emitting diode (OLED) screen and an under-screen unit disposed on a first side of the OLED screen. A through-hole is provided at a preset position of the under-screen unit. The key structure includes: a light-shielding unit, disposed on a side that is of the under-screen unit and that faces back from the OLED screen, where the light-shielding unit is fixedly connected to the under-screen unit, the light-shielding unit contains an accommodation space with a notch, and the notch is in communication with the through-hole; a light-emitting unit, disposed in the accommodation space; an optical unit, disposed in the accommodation space, and located between the OLED screen and the light-emitting unit, where light emitted by the light-emitting unit forms a preset key pattern on the OLED screen after passing through the optical unit; and a sensing unit, located on one side of the light-shielding unit. In this way, the present disclosure disposes the key structure inside the electronic device on the basis of ensuring normal implementation of functions of the key, without occupying an external arrangement region of the electronic device any longer, thereby avoiding an adverse effect on the increase of the screen-to-body ratio, and appropriately solving the problem that the key disposed on the electronic device in the prior art affects the increase of the screen-to-body ratio.

DETAILED DESCRIPTION

Figure 1:
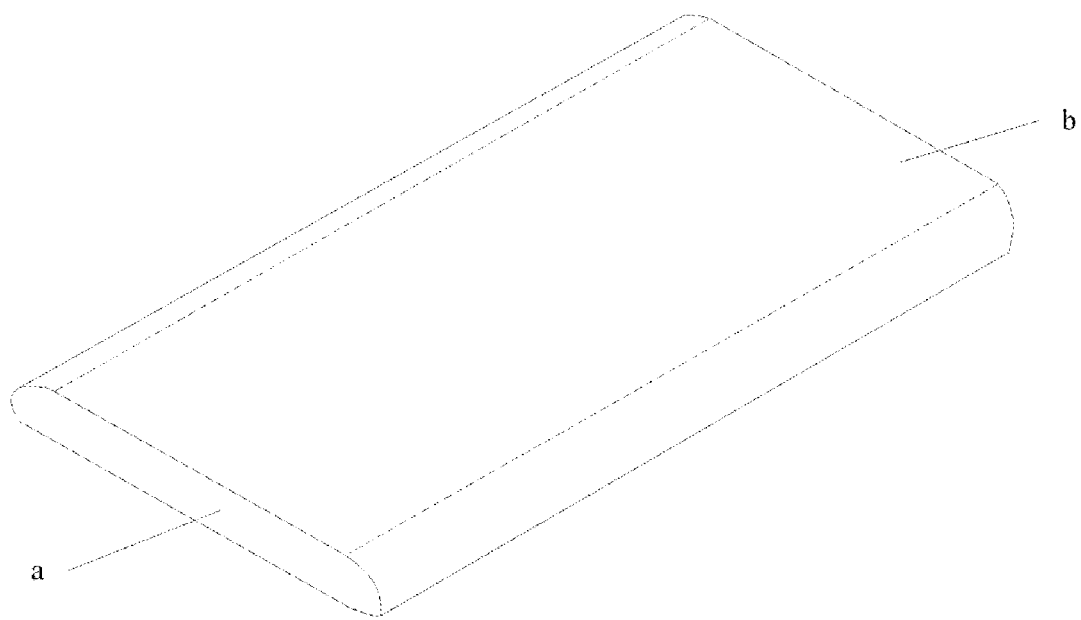
FIG. 1 is a schematic diagram of an electronic device with a curved screen in the prior art.

The following clearly describes the technical solutions in the embodiments of the present disclosure in full with reference to the accompanying drawings in the embodiments of the present disclosure. Apparently, the described embodiments are merely some of but not all of the embodiments of the present disclosure. All other embodiments derived by a person of ordinary skill in the art based on the embodiments of the present disclosure without making any creative efforts fall within the protection scope of the present disclosure.

In view of the problem that the key disposed on an electronic device in the prior art affects the increase of a screen-to-body ratio, the present disclosure provides a key structure, applied to the electronic device. As shown in FIG. 2 to FIG. 15 (a power-on key pattern is used as an example of a key pattern), the electronic device includes an organic light-emitting diode (OLED) screen 1 and an under-screen unit 2 disposed on a first side of the OLED screen 1 (alternatively, the first side may be an upper surface or a lower surface of the OLED screen). A through-hole is provided at a preset position of the under-screen unit 2. The key structure includes:

a light-shielding unit 3, disposed on a side (a surface) that is of the under-screen unit 2 and that faces back from the OLED screen 1, where the light-shielding unit 3 is fixedly connected to the under-screen unit 2, the light-shielding unit 3 contains an accommodation space with a notch, and the notch is in communication with the through-hole;

a light-emitting unit 4, disposed in the accommodation space;

an optical unit 5, disposed in the accommodation space, and located between the OLED screen 1 and the light-emitting unit 4, where light emitted by the light-emitting unit 4 forms a preset key pattern on the OLED screen 1 after passing through the optical unit 5 (alternatively, the light emitted by the light-emitting unit forms an image on the OLED screen after passing through the optical unit of the key structure, so as to render a corresponding pattern of the key structure); and a sensing unit, located on one side of the light-shielding unit 3.

The position relationship between the sensing unit and the light-shielding unit 3 is uncertain, and the two units may be located on the same layer of the electronic device instead, without being limited herein. The under-screen unit may include copper foil, foam, and the like, without being limited herein.

In the embodiments of the present disclosure, it is configured that the electronic device includes an organic light-emitting diode (OLED) screen and an under-screen unit disposed on a first side of the OLED screen. A through-hole is provided at a preset position of the under-screen unit. The key structure includes: a light-shielding unit, disposed on a side that is of the under-screen unit and that faces back from the OLED screen, where the light-shielding unit is fixedly connected to the under-screen unit, the light-shielding unit contains an accommodation space with a notch, and the notch is in communication with the through-hole; a light-emitting unit, disposed in the accommodation space; an optical unit, disposed in the accommodation space, and located between the OLED screen and the light-emitting unit, where light emitted by the light-emitting unit forms a preset key pattern on the OLED screen after passing through the optical unit; and a sensing unit, located on one side of the light-shielding unit. In this way, the present disclosure disposes the key structure inside the electronic device on the basis of ensuring normal implementation of functions of the key, without occupying an external arrangement region of the electronic device any longer, thereby avoiding an adverse effect on the increase of the screen-to-body ratio, and appropriately solving the problem that the key disposed on the electronic device in the prior art affects the increase of the screen-to-body ratio.

As shown in FIG. 2 to FIG. 15, the sensing unit includes at least one of a first sensing subunit 6, a second sensing subunit 7, or a third sensing subunit. The first sensing subunit 6 is disposed on one side of the through-hole (alternatively, may be disposed in the proximity of the through-hole, where the proximity is a position at which a touch operation performed at the preset key pattern can be sensed). The second sensing subunit 7 is disposed in a preset region on a second side of the OLED screen 1 (alternatively, the second side may be a lower surface or an upper surface of the OLED screen). The third sensing subunit is disposed in the accommodation space, and the third sensing subunit is located between the light-emitting unit 4 and the light-shielding unit 3. The second side is disposed opposite to the first side. The preset region includes a region for displaying the preset key pattern on the OLED screen 1.

Alternatively, the first sensing subunit is a pressure sensing unit; and/or the second sensing subunit is a fingerprint sensing unit; and/or the third sensing subunit is an optical sensing unit.

For example, the pressure sensing unit is a pressure sensor. The pressure sensor may be two capacitive electrode plates (that is, a capacitive pressure sensor). One of the electrode plates may be a light-transmitting flexible conductive material (such as graphene). This electrode plate adheres to a region for displaying the preset pattern on the OLED screen. When the user presses the region, the flexible electrode plate deforms to change a distance between the two electrode plates to implement pressure detection.

In the embodiments of this application, the optical unit includes at least one of a lens structure, a pinhole imaging structure, or a pattern layer disposed on the first side of the OLED screen.

Figure 4:
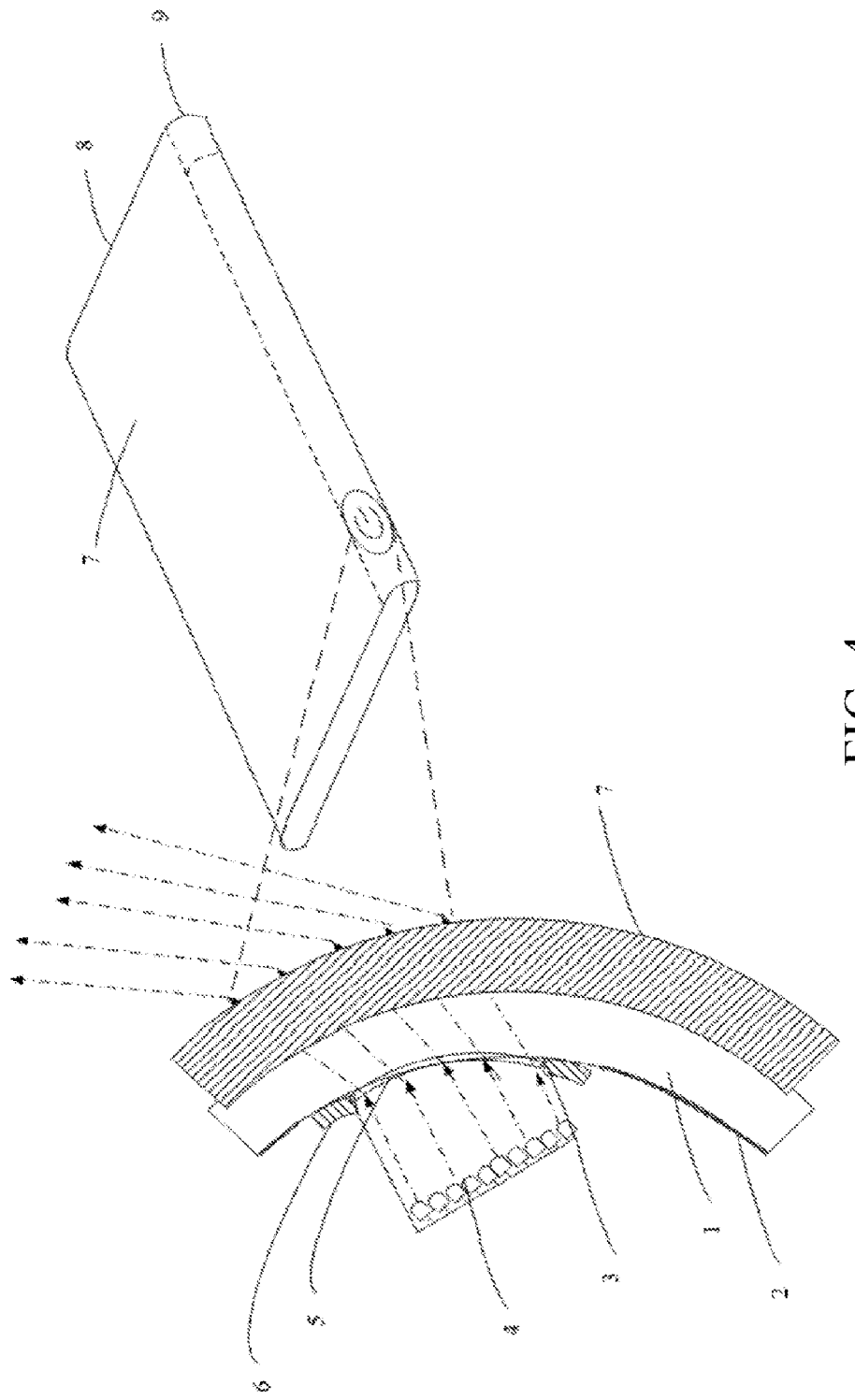
FIG. 4 is a second schematic structural diagram of an electronic device and a key structure according to an embodiment of the present disclosure.
Figure 14:
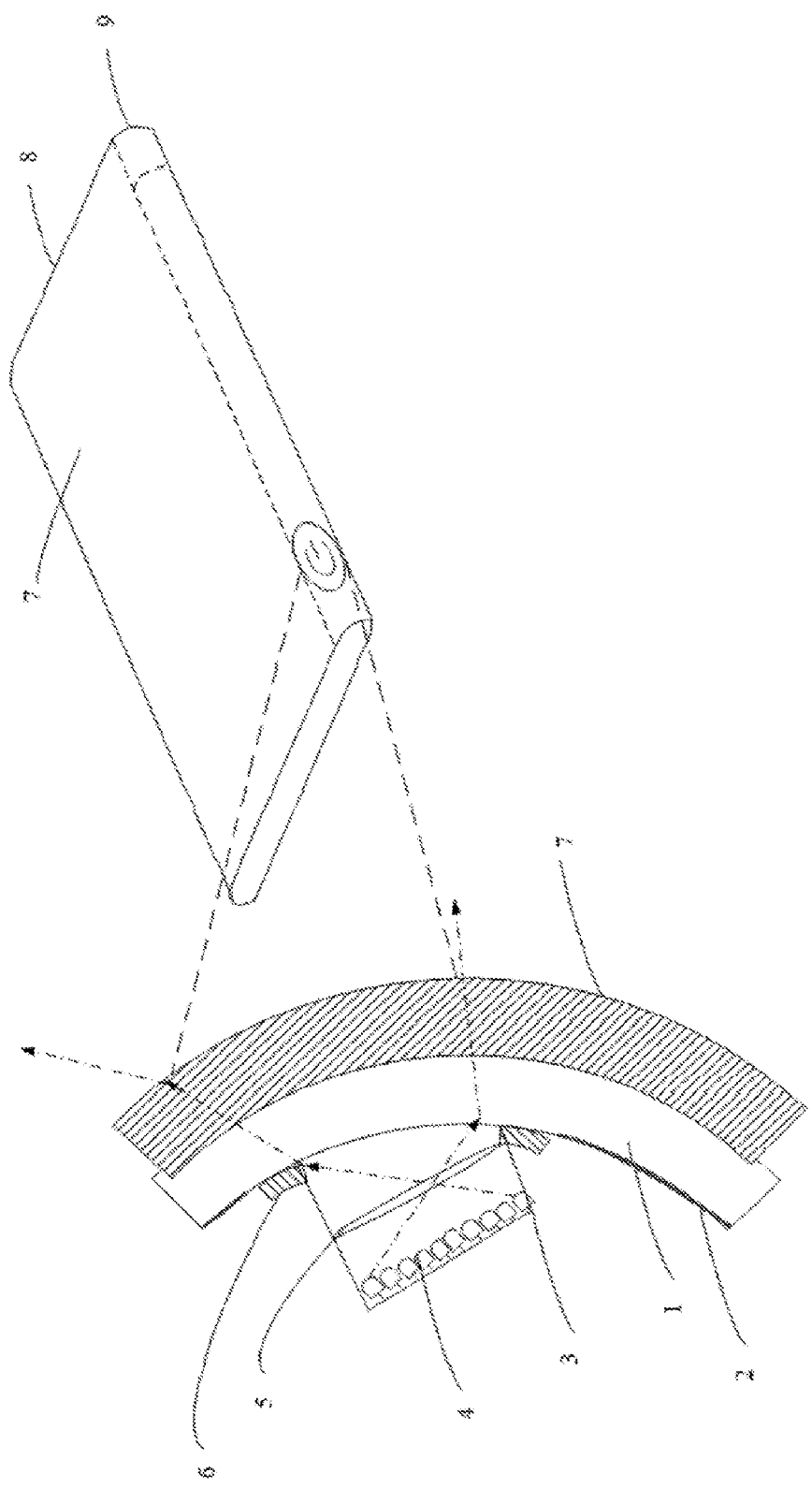
FIG. 14 is a fifth schematic structural diagram of an electronic device and a key structure according to an embodiment of the present disclosure.

As shown in FIG. 4 and FIG. 14, the OLED screen 1 is a curved screen. The curved screen includes a first display region 8 and a curved display region 9. The light-emitting unit 4, the light-shielding unit 3, the optical unit 5, and the sensing unit are all disposed on one side of the curved screen and are opposite to the curved display region 9.

An embodiment of the present disclosure further provides an electronic device. The electronic device includes the key structure described above.

The electronic device according to this embodiment of the present disclosure can implement all processes implemented by the electronic device described in the structure embodiments shown in FIG. 2 to FIG. 15, details of which are omitted here for brevity.

Figure 16:
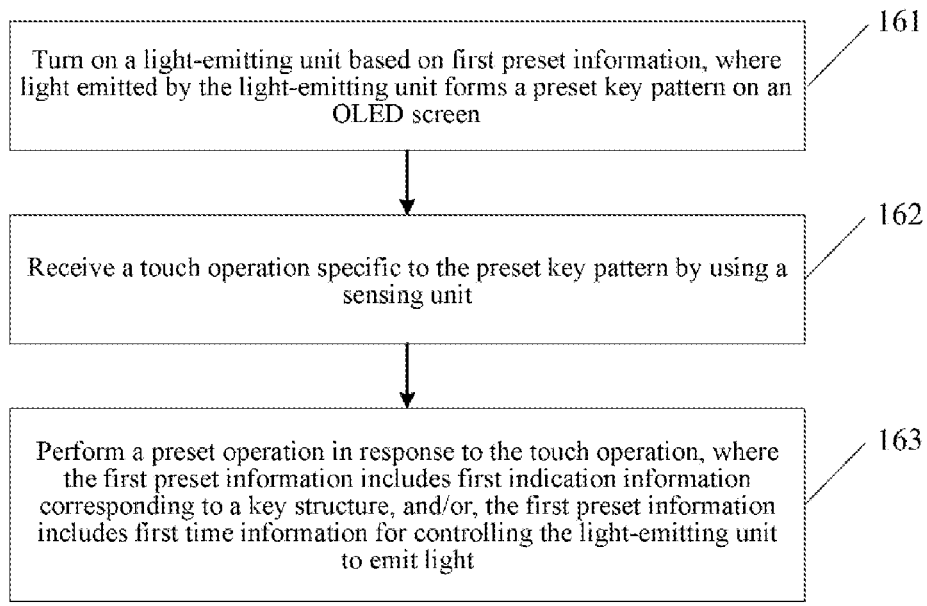
FIG. 16 is a schematic flowchart of a key control method according to an embodiment of the present disclosure.

An embodiment of the present disclosure further provides a key control method, applied to the electronic device described above. As shown in FIG. 16, the control method includes:

Step 161: Turn on the light-emitting unit (controlling light emission) based on first preset information, where the light emitted by the light-emitting unit forms the preset key pattern on the OLED screen.

Step 162: Receive a touch operation specific to the preset key pattern by using the sensing unit.

Step 163: Perform a preset operation (a function corresponding to the preset key pattern) in response to the touch operation.

The first preset information includes first indication information corresponding to the key structure, and/or, the first preset information includes first time information for controlling the light-emitting unit to emit light.

The key control method according to this embodiment of the present disclosure turns on the light-emitting unit based on the first preset information, where the light emitted by the light-emitting unit forms the preset key pattern on the OLED screen; receives a touch operation specific to the preset key pattern by using the sensing unit; and performs a preset operation in response to the touch operation, where the first preset information includes the first indication information corresponding to the key structure, and/or, the first preset information includes the first time information for controlling the light-emitting unit to emit light. This embodiment of the present disclosure can implement a key-pressing function of the key structure disposed inside the electronic device, and prevent the key structure from occupying an external arrangement region of the electronic device and from affecting the increase of the screen-to-body ratio, thereby appropriately solving the problem that the key disposed on the electronic device in the prior art affects the increase of the screen-to-body ratio.

The first time information includes at least one of the following information: first information for controlling, in a case that the electronic device is in a screen-off state for a first duration, the light-emitting unit to continuously emit light for a second duration; or second information for controlling, in a case that the electronic device is in the screen-off state for a third duration, the light-emitting unit to intermittently emit light for a fourth duration.

It is to be noted that the screen-off state may include a lock-screen screen-off state and a power-off screen-off state. The time information corresponding to the two states may be consistent or inconsistent. Correspondingly, the first duration may include a plurality of sub-durations, without being limited herein.

In this embodiment of the present disclosure, touch modes of the touch operation include at least two touch modes, and the preset operation includes at least two target operations. Each touch mode corresponds to one of the target operations.

In this way, it is ensured that the electronic device implements a plurality of key functions.

Similarly, the touch modes of the touch operation include at least two touch modes, the first time information includes at least two types of time information. Each touch mode corresponds to one type of the time information.

In this way, it is convenient to use different touch modes at different time.

Alternatively, the preset operation includes at least two target operations, and the first time information includes a plurality of pieces of first time sub-information. Each different target operation corresponds to a different piece of the first time sub-information.

In this way, it is ensured that the electronic device implements a plurality of key functions, and it is convenient to distinguish between moments of triggering the plurality of key functions implemented by the electronic device.

In this embodiment of the present disclosure, the light emitted by the light-emitting unit forms at least two preset key patterns on the OLED screen. Each different preset key pattern corresponds to a first trigger operation that generates different first indication information; or the first time information includes a plurality of pieces of second time sub-information, and each different piece of second time sub-information corresponds to a different preset key pattern.

In this way, a plurality of key functions can be implemented by one key structure, thereby saving hardware resources and deployment space.

The turning on the light-emitting unit based on first preset information includes: obtaining a light-emitting parameter specific to the preset key pattern based on the first preset information; and turning on the light-emitting unit based on the light-emitting parameter, where the light-emitting parameter includes at least one of light-emitting color, light-emitting intensity, light-emitting frequency, or light-emitting duration.

In this way, the key structure can be controlled to render different key patterns to implement different key functions.

Further, before the preset operation is performed in response to the touch operation, the control method further includes: changing a light-emitting parameter of the light-emitting unit in a case that the touch operation specific to the preset key pattern is received by using the sensing unit, where the light-emitting parameter includes at least one of light-emitting color, light-emitting intensity, light-emitting frequency, or light-emitting duration.

In this way, it is convenient for the user to be aware that the key structure is triggered.

Further, before the preset operation is performed in response to the touch operation, the control method further includes: controlling, after the touch operation specific to the preset key pattern is received by using the sensing unit, the electronic device to vibrate based on a first preset rule.

Alternatively, a motor of the electronic device (a motor in a main unit) may be controlled to vibrate, or the vibration occurs based on existing screen vibration technology or the like, without being limited herein.

In this way, it is even more convenient for the user to be aware that the key structure is triggered.

In this embodiment of the present disclosure, after the preset operation is performed in response to the touch operation, the control method further includes: turning off the light-emitting unit based on second preset information, where the second preset information includes second indication information corresponding to the key structure, and/or, the second preset information includes second time information for controlling the light-emitting unit to be turned off.

In this way, excessive power consumption of the electronic device is avoided.

The second time information includes at least one of the following information: third information for controlling, in a case that the electronic device is in a powered-on screen-on state for a fifth duration, the light-emitting unit to continuously turn off for a sixth duration; or fourth information for controlling, in a case that the electronic device is in the powered-on screen-on state for a seventh duration, the light-emitting unit to intermittently turn off for an eighth duration.

Alternatively, the light emitted by the light-emitting unit forms at least two preset key patterns on the OLED screen. Each different preset key pattern corresponds to a second trigger operation that generates different second indication information; or the second time information includes a plurality of pieces of third time sub-information, and each different piece of third time sub-information corresponds to a different preset key pattern.

In this way, it is ensured that the plurality of key functions that can be implemented by one key structure can be disabled normally.

In this embodiment of the present disclosure, in a case that the sensing unit includes a pressure sensing unit, the receiving a touch operation specific to the preset key pattern by using a sensing unit, and performing a preset operation in response to the touch operation, include: receiving first pressure information by using the pressure sensing unit; determining pressure gradient information based on the first pressure information; determining, based on the pressure gradient information, pressure center position information corresponding to the first pressure information; and performing the preset operation in response to the touch operation in a case that the pressure center position information matches position information of the preset key pattern.

In this way, the key is not triggered until the pressure center position information matches the position information of the preset key pattern, thereby ensuring precise triggering of the key function and preventing the key from being triggered by mistake.

The following further describes a key structure and a key control method according to an embodiment of the present disclosure. A power-on function is used as an example of the function of the key structure, and a mobile terminal is used as an example of the electronic device.

Figure 2:
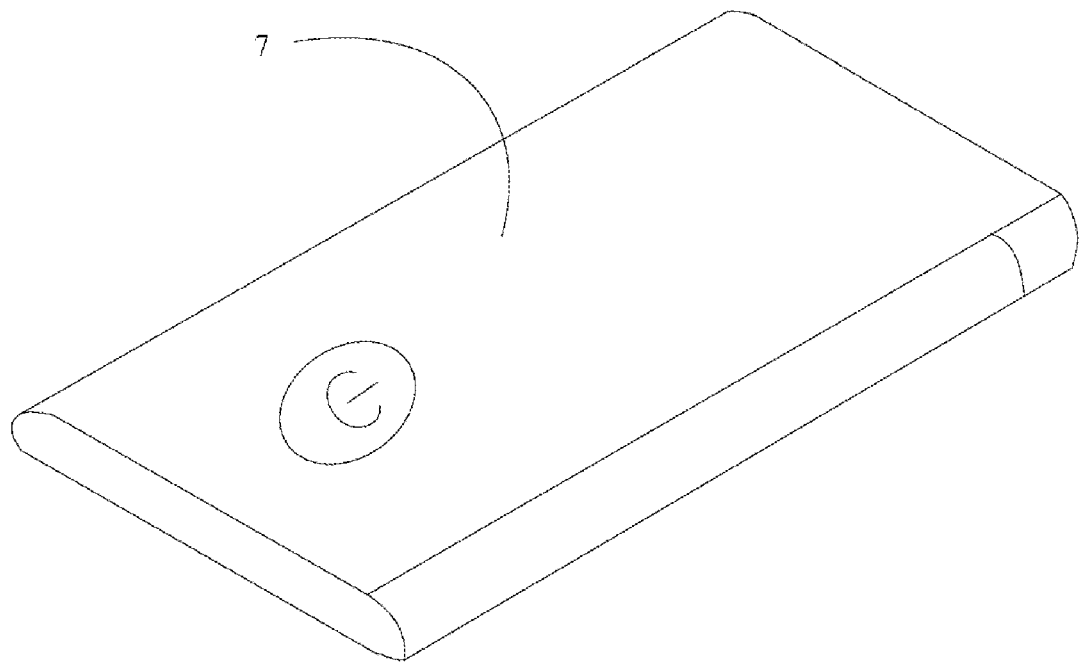
FIG. 2 is a first schematic structural diagram of an electronic device according to an embodiment of the present disclosure.

In view of the technical problem described above, an embodiment of the present disclosure provides a key structure and a key control method. Alternatively, this embodiment of the present disclosure relates to a solution to an under-screen hidden power-on key. In this solution, the light emitted and processed under the screen is displayed as a power-on pattern through the screen (as shown in FIG. 2) by virtue of translucent characteristics of a flexible OLED screen. In addition, a fingerprint sensing unit (a touchscreen unit is used as an example below) and/or a sensor unit (a pressure sensor is used as an example below) disposed near the power-on pattern detect the user's power-on operation. The solution includes a structure implementation method and a control method to implement the functions of the power-on key under the OLED screen.

The following describes the solution of this embodiment of the present disclosure in detail with examples.

Example I

Figure 17:
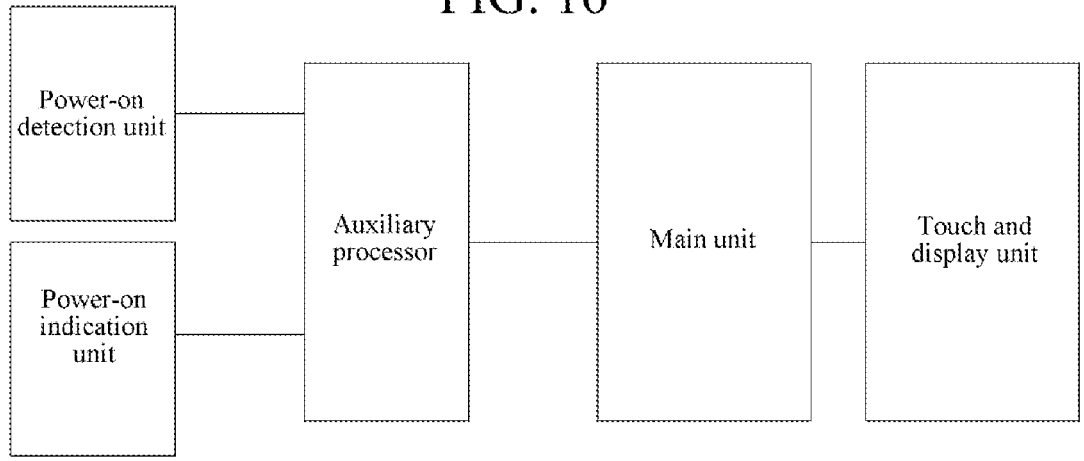
FIG. 17 is a first block diagram of a mobile terminal according to an embodiment of the present disclosure.
Figure 18:
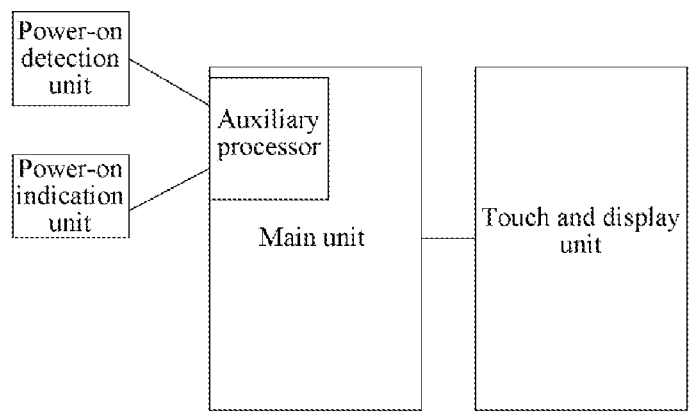
FIG. 18 is a second block diagram of a mobile terminal according to an embodiment of the present disclosure.

As shown in FIG. 17 and FIG. 18, a mobile terminal in this example includes at least a touchscreen and display unit, an auxiliary processor unit, a power-on detection unit, and a power-on indication unit.

In the touchscreen (unit) and display unit, a display unit is formed by a flexible OLED screen, and is configured to display a graphical user interface; and a touchscreen unit is configured to sense the user's touch operation. The touchscreen unit is an optional unit.

The auxiliary processor unit is configured to control the power-on indication unit to indicate a power-on position to the user, compute an electrical signal collected by the power-on detection unit, make a judgment, and control a main unit to power on. An auxiliary processor may be a microcontroller unit (Microcontroller Unit, MCU) independent of the main unit, or a submodule integrated in the main unit.

The power-on detection unit is disposed near the power-on indication region (a region for displaying the preset key pattern) (located in the preset region), and can sense a generated or changed signal such as an acoustic, optical, or electrical signal when the user touches or presses the power-on indication unit. The power-on detection unit in this Example I is a pressure sensor.

The power-on indication unit is configured to indicate a power-on region to the user.

The main unit may include a main system such as a central processing unit (Central Processing Unit, CPU), a memory, and a power supply, and can control the auxiliary processor and the touchscreen and display unit.

The implementation of the structure in the example is described below:

1. The light-emitting unit is formed by one or more light-emitting diodes disposed under the power-on region of the OLED screen.

Figure 3:
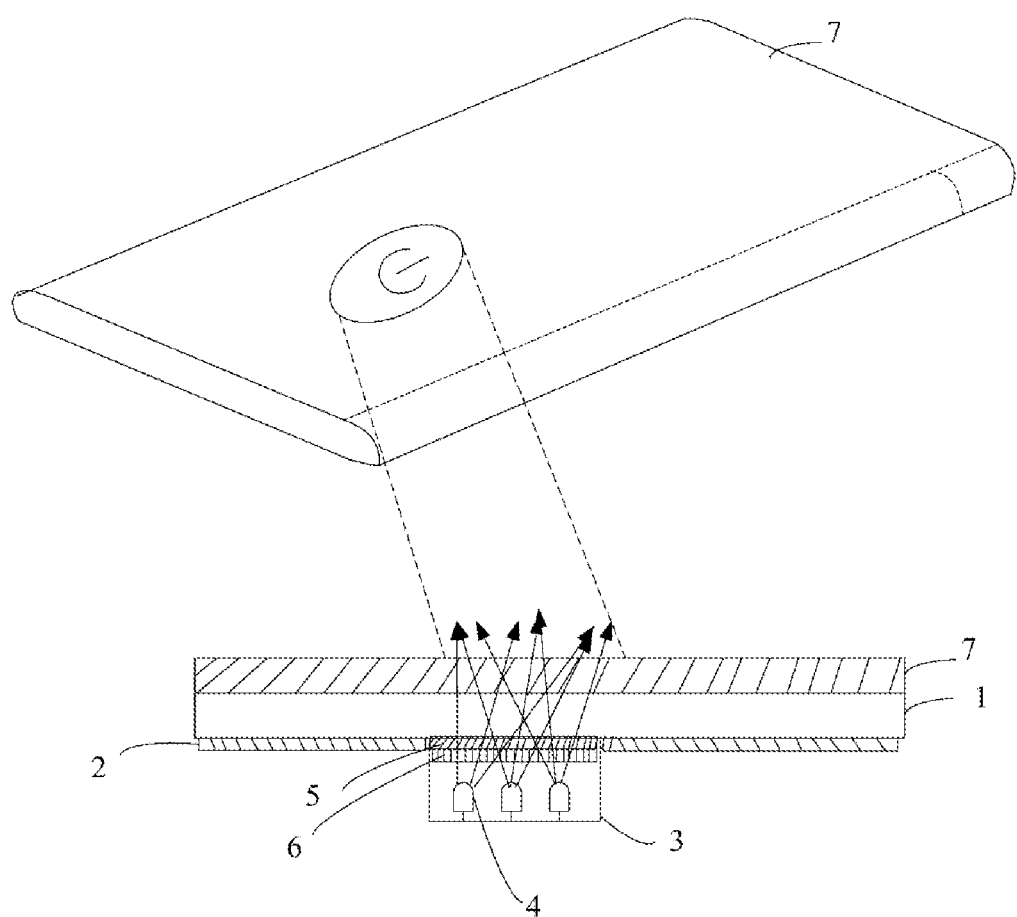
FIG. 3 is a first schematic structural diagram of an electronic device and a key structure according to an embodiment of the present disclosure.

2. By virtue of the translucent characteristics of the flexible OLED screen, the light emitted by the light-emitting unit passes through the OLED screen after being optically processed by the optical unit, where the optical processing includes, for example, refraction, scattering, polarization, shielding, filtering, light guiding, light homogenizing, diffusion, or diffraction, and then power-on pattern light is emitted in a display region of the screen. A cross-sectional view of the structure is shown in FIG. 3 (when the power-on indication region is located on the front of the screen) and FIG. 4 (when the power-on indication region is located on a lateral side of the screen).

The pressure sensor may be deployed just on the periphery of the light-shielding unit as long as the sensor can detect a pressing operation on the power-on indication region.

Figure 5:
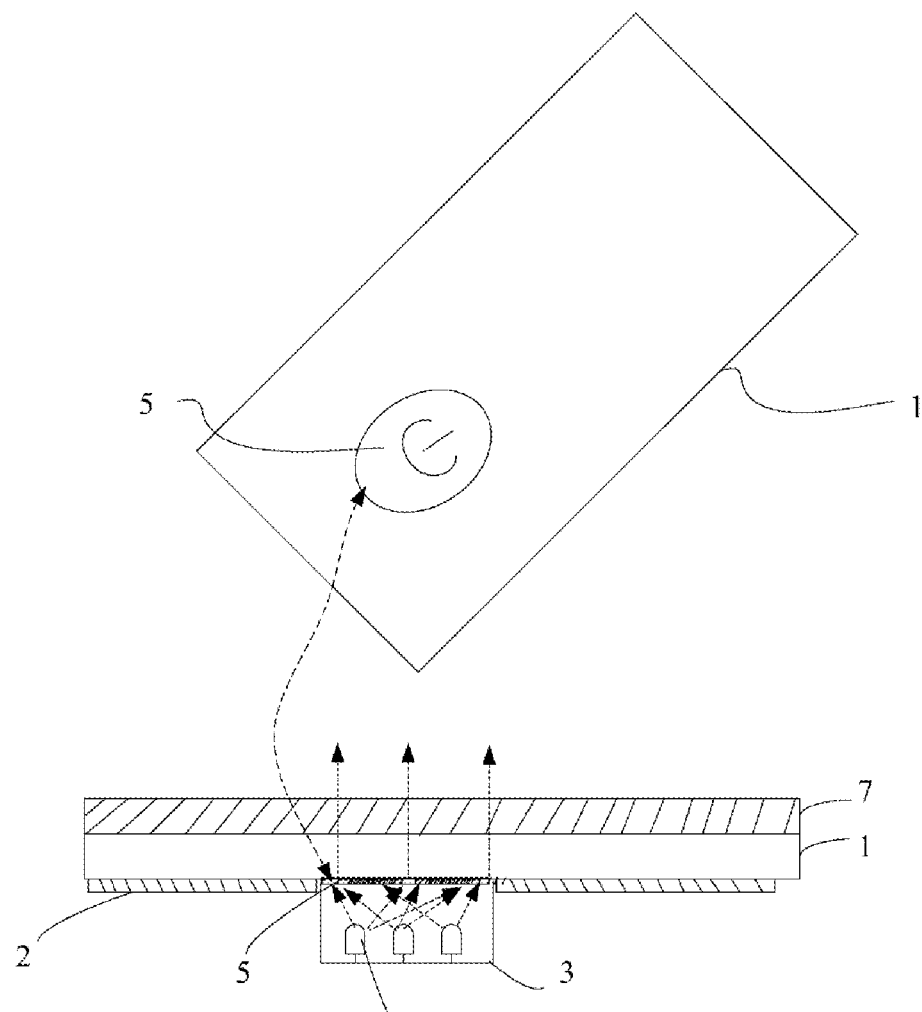
FIG. 5 is a third schematic structural diagram of an electronic device and a key structure according to an embodiment of the present disclosure.

3. A simple implementation of the optical unit is shown in FIG. 5. Ink is sprayed onto the back (a lower surface) of the OLED screen to implement transmission and shielding of light (black ink shielding light, and white ink transmissive light). A power-on indication pattern is formed once the light emitted by the light-emitting unit is cast to the ink on the back of the OLED screen.

Figure 6:
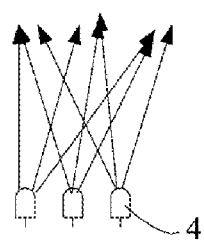
FIG. 6 is a schematic diagram of a light-emitting unit according to an embodiment of the present disclosure.

4. The light-emitting unit (as shown in FIG. 6) may adopt a single light source with different intensities and spectrums as required by the effect of the power-on indication pattern, or use a plurality of light sources to synthesize different lighting effects. For example, a white power-on pattern light is rendered by mixing colors of light emitted by a plurality of light-emitting diodes, or a blue power-on pattern light is rendered by a single blue light emitted by one or more diodes.

5. The light-shielding unit may be made of a material such as light-shielding foam. Disposed around the light-emitting unit under the screen, the light-shielding unit mainly serves to isolate ambient light, and seal the light emitted by the light-emitting unit and shield the light from irradiating other positions in the screen than the OLED power-on indication region.

6. The pressure sensor is disposed near the light-emitting unit, and in a position not specifically limited. The position is appropriate as long as the pressure exerted by the user can be sensed when the user presses a region indicated by the power-on pattern.

In this example, as shown in FIG. 3, a pressure detection component in the pressure sensor may be made of a transparent material or a pressure-sensitive material that is disposed under a black ink region of the optical unit. The pressure detection component made of such a material can detect a screen-pressing operation of the user in the power-on indication region without affecting the light-emitting unit in forming a power-on indication pattern.

In another implementation, as shown in FIG. 4, the pressure sensor is disposed on the periphery of the optical unit in the curved power-on indication region, and can also detect the pressure exerted by the user who presses the screen in the power-on indication pattern region.

7. The structure implementation method of the touchscreen and the OLED screen are not limited, and the materials of other units under the OLED screen, such as copper foil and foam, are not limited, as long as such materials are hollowed out in the key indication region without shielding the light emitted by the light-emitting unit.

Figure 7:
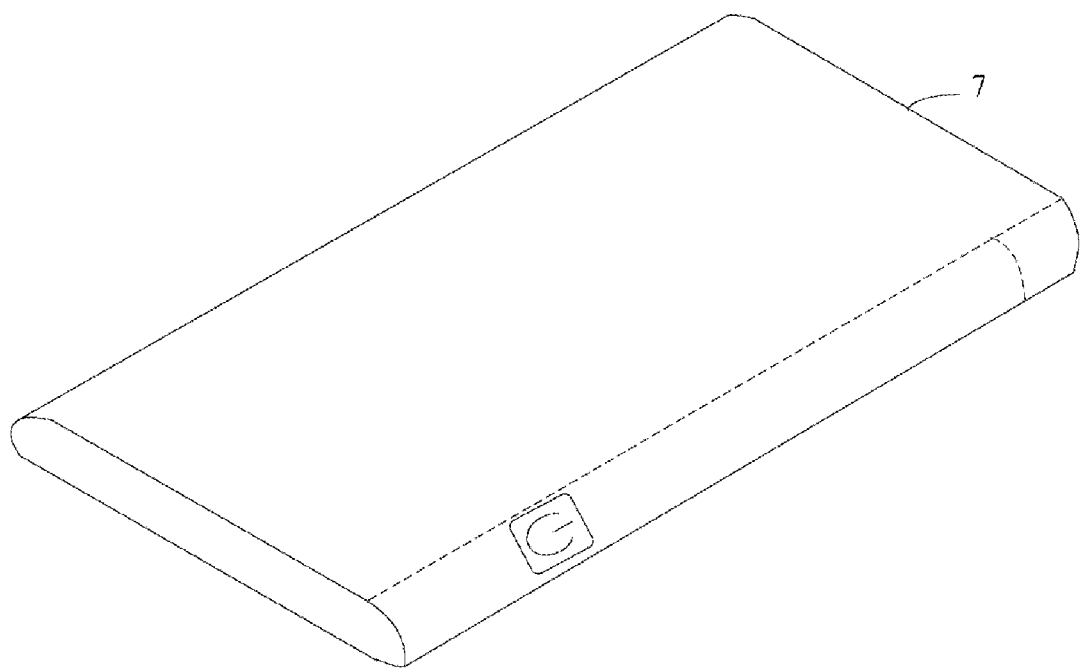
FIG. 7 is a second schematic structural diagram of an electronic device according to an embodiment of the present disclosure.
Figure 8:
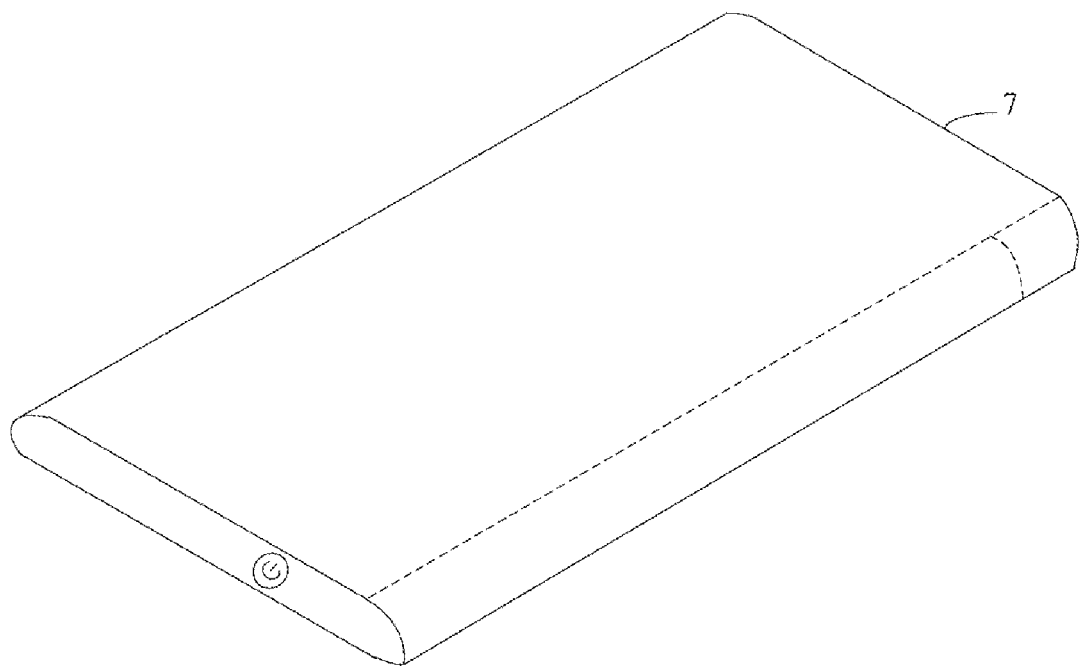
FIG. 8 is a third schematic structural diagram of an electronic device according to an embodiment of the present disclosure.
Figure 9:
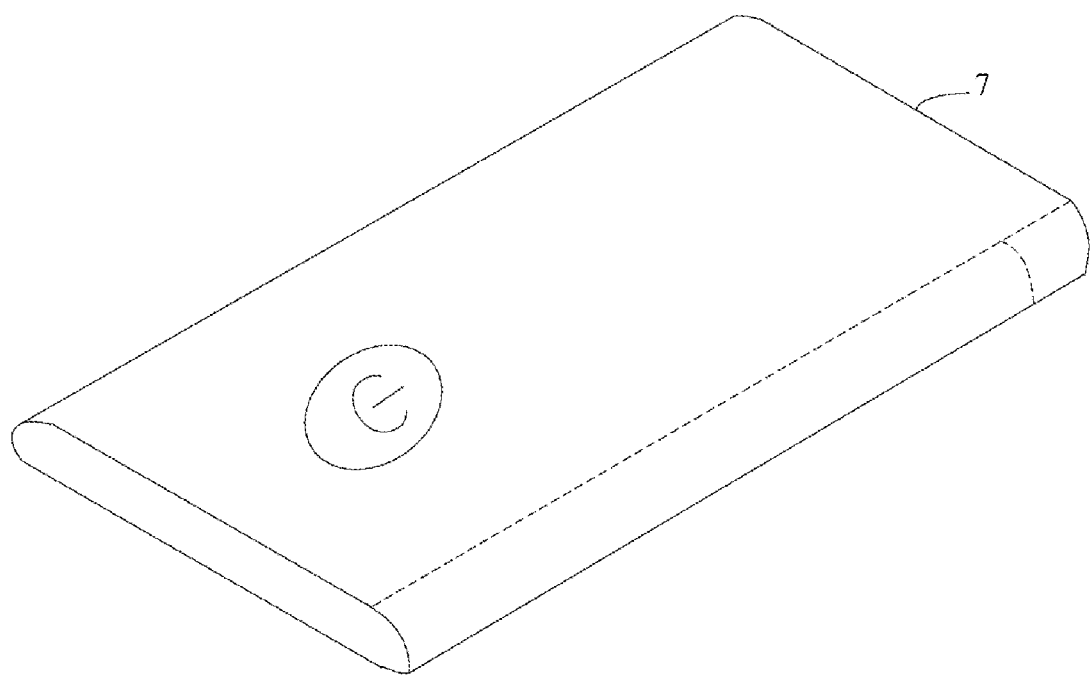
FIG. 9 is a fourth schematic structural diagram of an electronic device according to an embodiment of the present disclosure.
Figure 10:
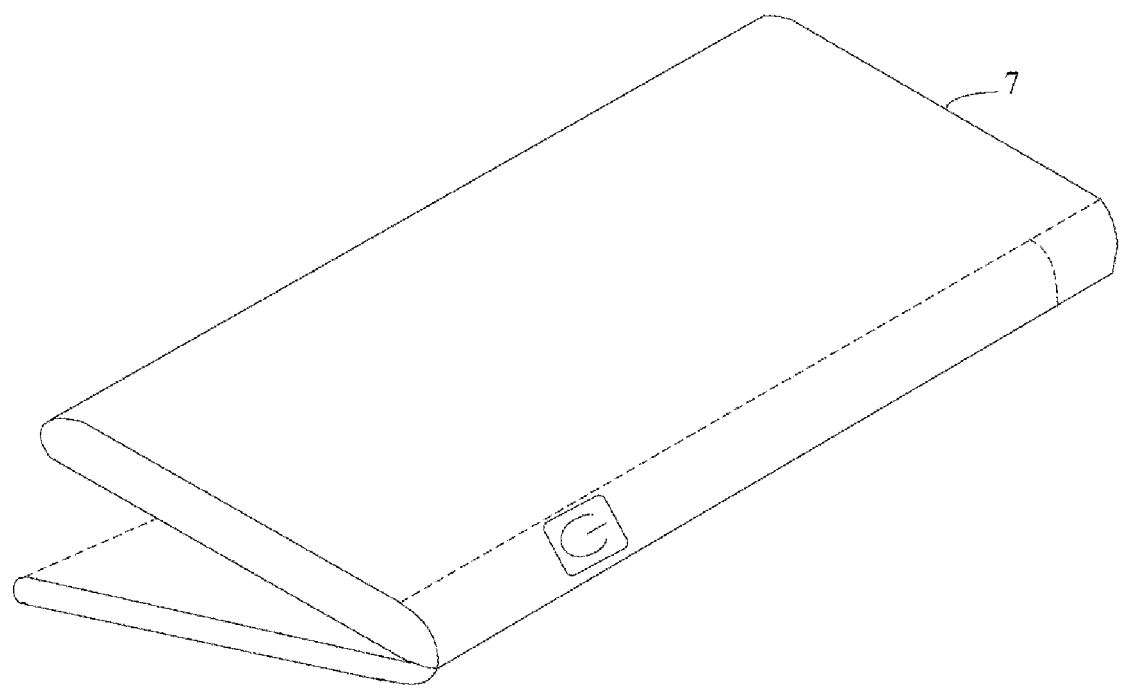
FIG. 10 is a fifth schematic structural diagram of an electronic device according to an embodiment of the present disclosure.
Figure 11:
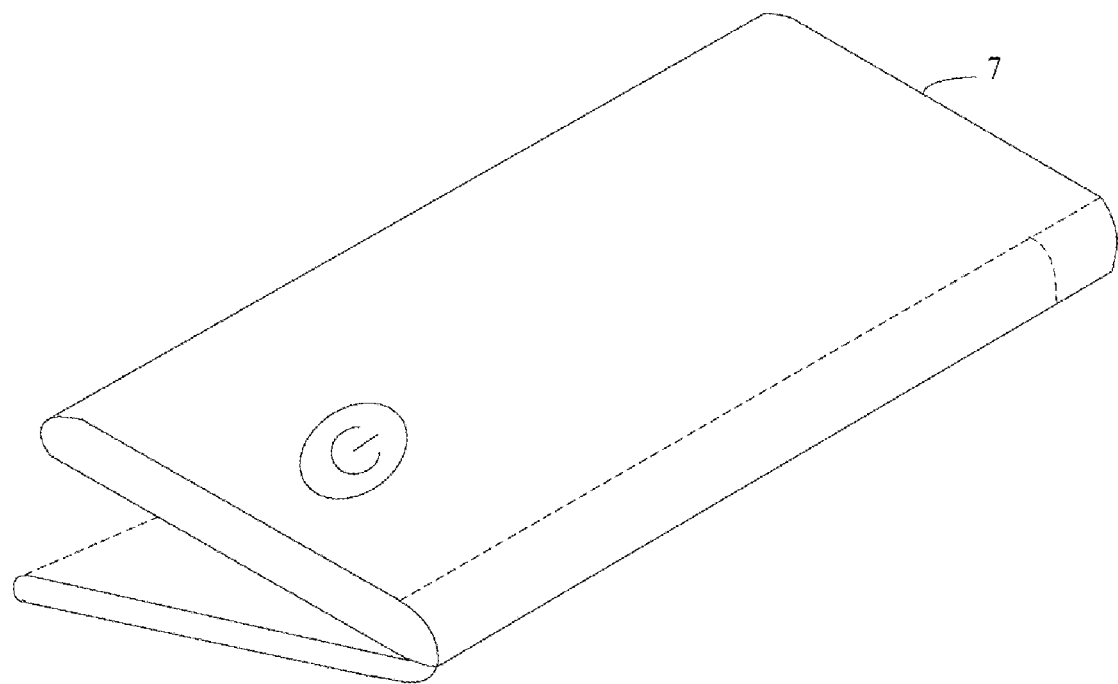
FIG. 11 is a sixth schematic structural diagram of an electronic device according to an embodiment of the present disclosure.
Figure 12:
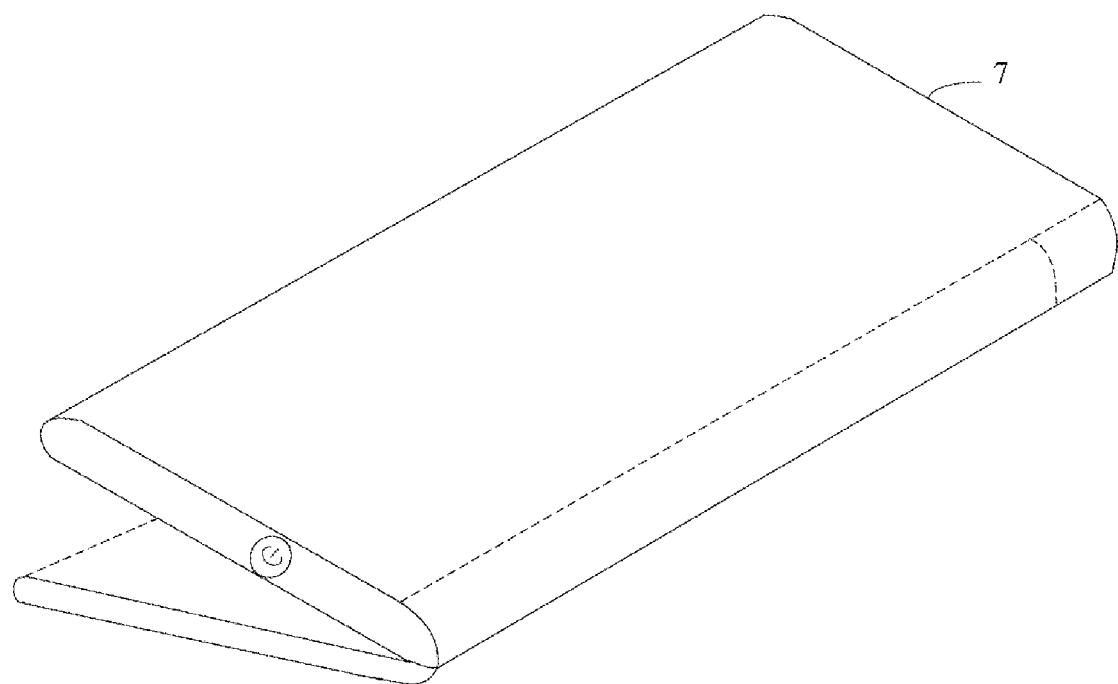
FIG. 12 is a seventh schematic structural diagram of an electronic device according to an embodiment of the present disclosure.

8. One or more hidden power-on keys may be arranged at any one or more positions under the screen (as long as the position is under the OLED screen, without limiting the number and specific position of the keys). As shown in FIG. 7 to FIG. 9, the hidden power-on key is located on the lateral side of a large curved surface (such as a double-sided screen) or on the front of the mobile terminal (in FIG. 7, the hidden power-on key is located in the curved surface part of the lateral side; in FIG. 8, the hidden power-on key is located at an upper or lower lateral position; and, in FIG. 9, the hidden power-on key is located on the front or back of the screen). As shown in FIG. 10 to FIG. 12, the hidden power-on key is located on the lateral side or front of the mobile terminal with a foldable screen (in FIG. 10, the hidden power-on key is located in the curved surface part of the lateral side of the foldable screen; in FIG. 11, the hidden power-on key is located on the front or back of the screen; and, in FIG. 12, the hidden power-on key is located at the upper or lower lateral position).

Figure 19:
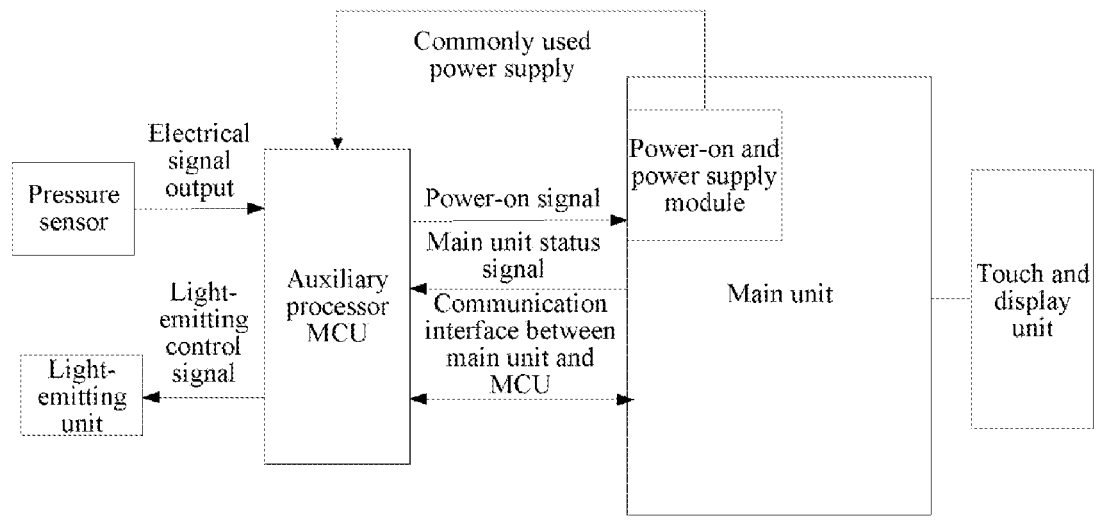
FIG. 19 is a block diagram of system control in a first example according to an embodiment of the present disclosure.

The control method of the foregoing structures is described below:

FIG. 19 shows a control block diagram of this example. When the main unit is in a power-off state, the auxiliary processor can independently control and detect the pressure sensor and the light-emitting unit, compute a voltage signal generated by the sensing of the pressure sensor, and make a judgment; and trigger a power-on operation of the main unit when the power-on conditions are met.

Figure 20:
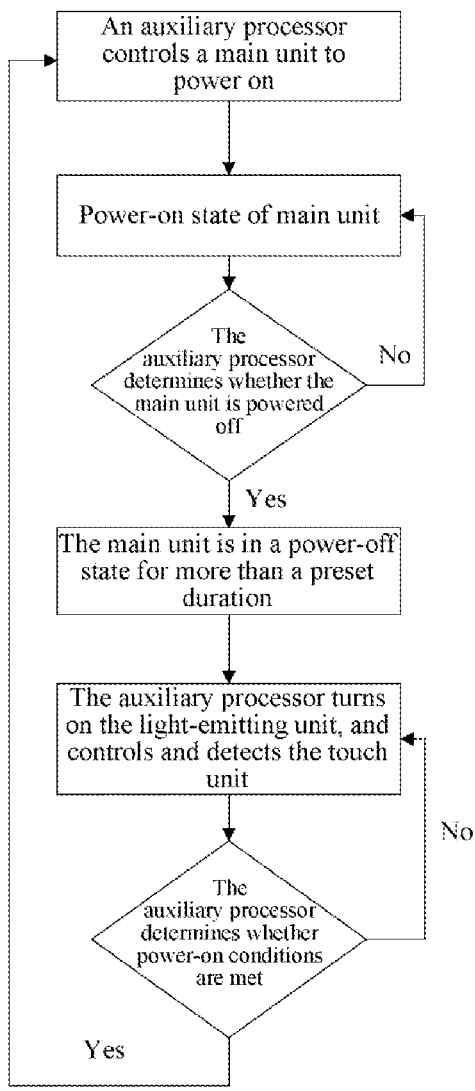
FIG. 20 is a schematic flowchart of system control in a first example according to an embodiment of the present disclosure.

A specific process is as follows: As triggered by an operation, the auxiliary processor controls the light-emitting unit to emit light (that is, emit light passively); or, the light may be emitted actively, as described below:

1. As shown in FIG. 20, the auxiliary processor determines the status of the main unit based on a main unit status signal. When detecting that the main unit is in a power-off state for a preset duration T0, the auxiliary processor controls the light-emitting unit to emit light, indicates the power-on region to the user, and at the same time, turns on a power-on key detection unit (pressure sensor) to detect the user's pressing behavior in real time.

Alternatively, the auxiliary processor receives a power-off command of the main unit through a communication interface between the main unit and the auxiliary processor. Upon expiration of a preset duration T1 (T1 is greater than, and may be determined based on, a total power-off duration) after receiving the power-off command, the auxiliary processor controls the light-emitting unit to emit light, indicates the power-on region to the user, and at the same time, turns on the pressure sensor to detect the user's pressing operation in real time.

After the power-on indication screen region is pressed, the auxiliary processor detects that the electrical signal output by the pressure sensor exceeds a preset threshold V0. When the detected signal V0 lasts longer than a preset value T2, the auxiliary processor sends a power-on signal to the main unit to power on.

2. The auxiliary processor may control, in diverse ways, the light-emitting unit to emit light. The light-emitting unit may be turned on intermittently at a preset frequency, so as to reduce power consumption of the light emission. For example, if the preset frequency is 60 Hz, the light-emitting unit is turned off and turned on once per period of 1/60 second. A ratio of a turn-on duration to a turn-off duration in one period depends on the desired effect of the power-on pattern light.

3. The main unit supplies power to the auxiliary processor constantly, or the auxiliary processor is directly powered by the battery. When the main unit is in a turn-off state, the auxiliary processor keeps operating at low power consumption to control the light-emitting unit and detect signals of the pressure sensor.

4. Optionally, when the auxiliary processor detects a signal converted into an electrical signal indicating that the power-on indication screen region has been pressed for a duration longer than a preset threshold V1, the auxiliary processor controls the light-emitting unit to change the light-emitting color or intensity.

5. Optionally, when the auxiliary processor detects a signal converted into an electrical signal indicating that the power-on indication screen region has been pressed for a duration longer than a preset threshold V2, the auxiliary processor controls a motor in the main unit to vibrate.

6. Optionally, when detecting that the main unit is in a power-on screen-on state or receiving a main unit turn-off key command, the auxiliary processor turns off the light-emitting unit and the power-on key detection unit.

7. Optionally, when detecting that the main unit is in a power-on screen-off state, the auxiliary processor turns on the light-emitting unit and the power-on key detection unit, so as to implement a screen-on function in the screen-off state.

8. Optionally, a pressure gradient difference between the power-on indication region and the periphery (when the power-on indication region is pressed by a finger, the pressure is the largest in the power-on indication region, and gradually declines on the periphery extending outward) is used to assist in making a judgment, so as to prevent mistaken pressing (for example, when both the power-on indication region and the periphery are pressed).

The solution in this Example I can: remove the physical power-on key; power on a mobile terminal from the lateral side of a curved screen or foldable screen when a hidden full screen is implemented at low power consumption; keep integrity of the front, lateral side, or back of the whole mobile terminal, increase the screen-to-body ratio of the mobile terminal, and improve the appearance aesthetics and visual experience; render different lighting effects as a power-on indication to the user when the mobile terminal is in a power-off state, and enhance technological attributes of the mobile terminal.

Figure 21:
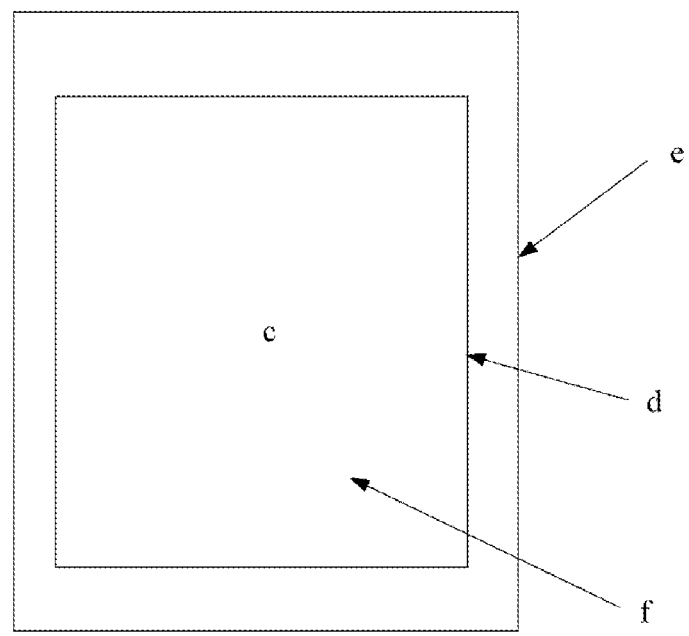
FIG. 21 is a first schematic diagram of applying a key structure according to an embodiment of the present disclosure.
Figure 22:
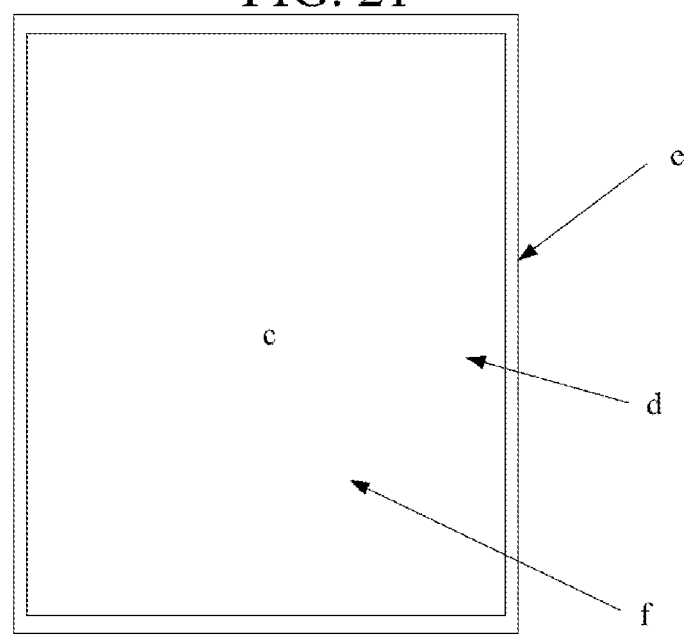
FIG. 22 is a second schematic diagram of applying a key structure according to an embodiment of the present disclosure.
Figure 23:
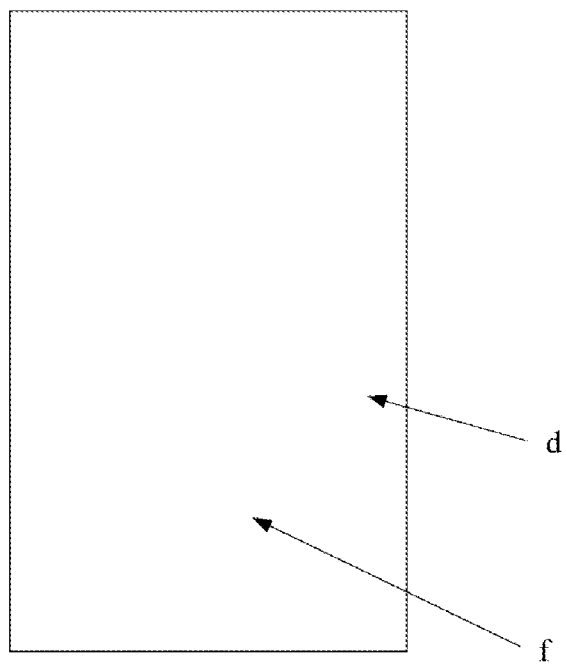
FIG. 23 is a third schematic diagram of applying a key structure according to an embodiment of the present disclosure.

The solution is also applicable to a mobile terminal equipped with a combination of a display screen and touch-screen characterized by a very high screen-to-body ratio, or equipped with a single display screen, as shown in FIG. 21 to FIG. 23, in which c represents a screen display region, d represents a display screen, e represents a touchscreen, and f represents a hidden key (the key structure described above) located under the display screen.

Example II

Figure 13:
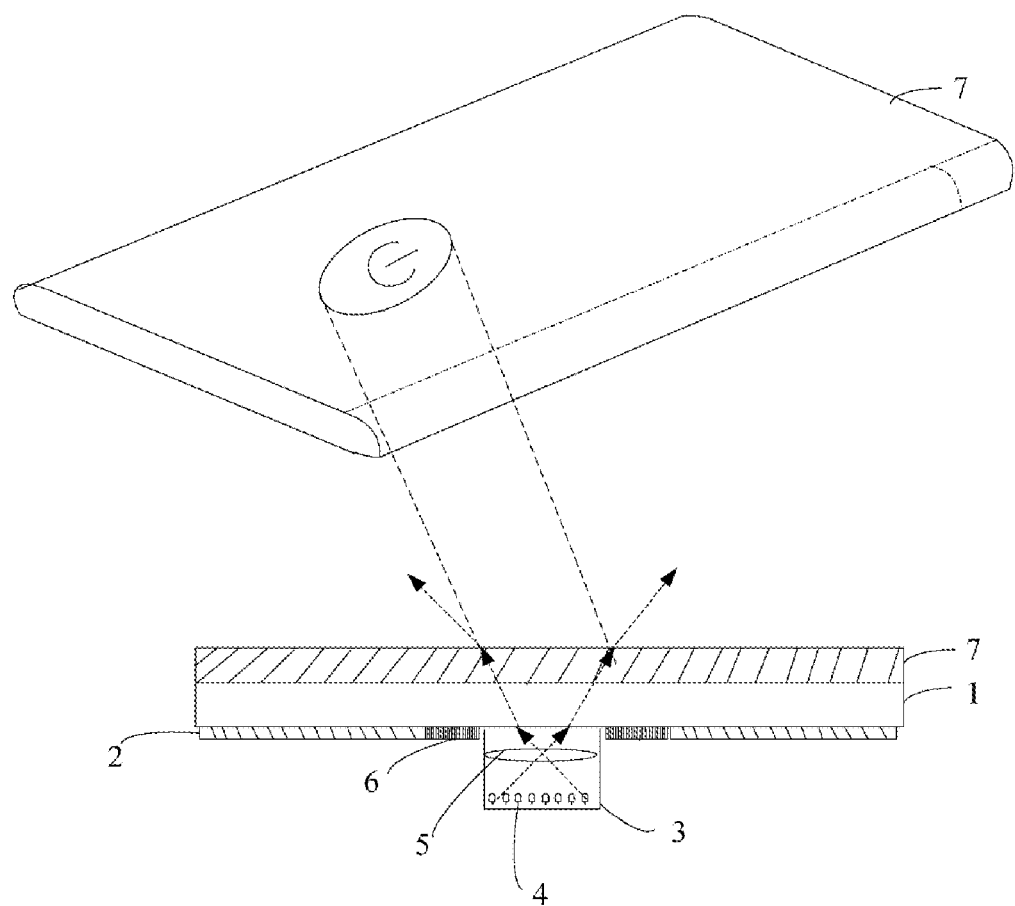
FIG. 13 is a fourth schematic structural diagram of an electronic device and a key structure according to an embodiment of the present disclosure.

This example differs from Example I in that the light emitted by the light-emitting unit passes through the flexible screen OLED after being refracted by a pinhole (not shown) or a lens, and displays a power-on pattern in the power-on indication region, as shown in FIG. 13 (a front power-on pattern, displayed in a case that the power-on indication region is located on the front of the screen) and FIG. 14 (a lateral curved surface power-on pattern, displayed in a case that the power-on indication region is located on the lateral side of the screen). Other parts of the structure may be learned by referring to Example II, and are omitted herein.

The control flow in this example is the same as that in Example I, and is omitted here.

It is to be noted that in this embodiment of the present disclosure, the solution that uses a pressure sensor for detection no longer requires the touchscreen unit for performing relevant detection (for example, if the user's pressure on the power-on indication region is detected by the pressure sensor, the touchscreen unit is no longer required for detecting the user's touch on the power-on indication region).

In Example I, black ink shielding light or white ink transmissive light is used to display the power-on indication pattern. With the power-on pattern being fixed, just the pattern color and light-emitting intensity are changeable. In Example II, the auxiliary processor can control the light-emitting unit to change a light-emitting pattern, and the pattern is imaged through a pinhole or cast over a lens to display different power-on patterns and lighting effects through the screen. Other advantages over existing solutions can be learned by referring to Example I.

Example III

Figure 15:
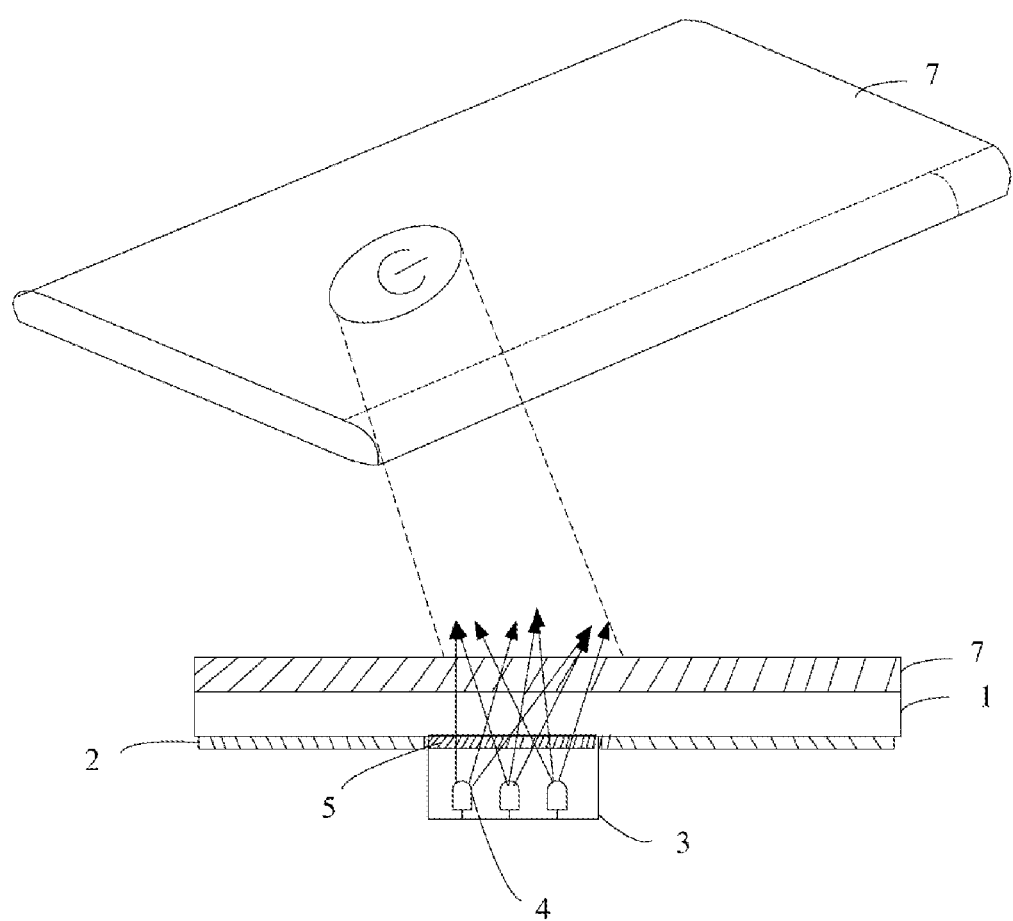
FIG. 15 is a sixth schematic structural diagram of an electronic device and a key structure according to an embodiment of the present disclosure.

This example differs from Example I in that the user's power-on operation is detected by a touchscreen unit in the power-on indication region, but not by a pressure sensor any longer, as shown in FIG. 15 (the power-on indication region is located on the front of the screen).

Figure 24:
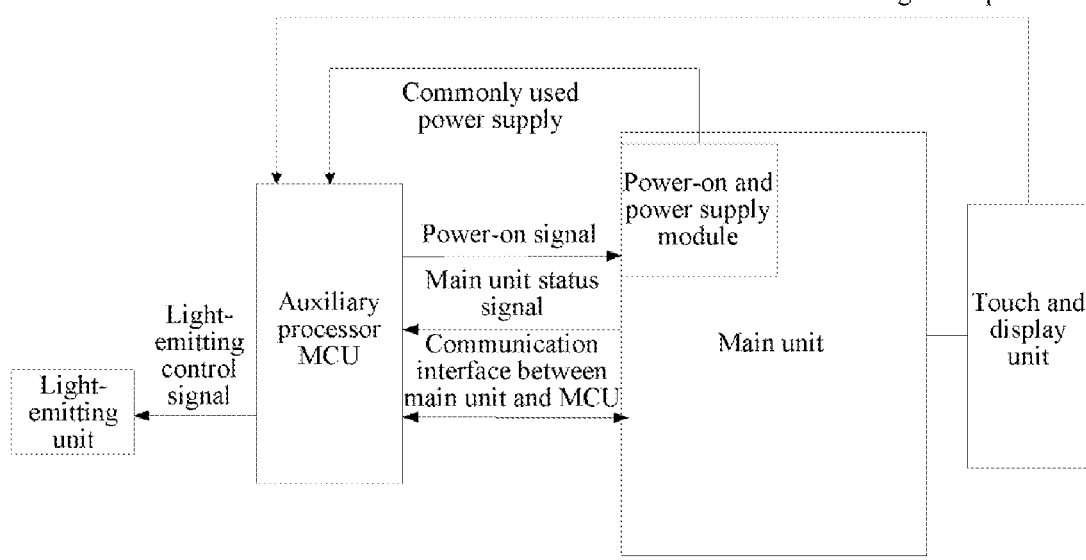
FIG. 24 is a block diagram of system control in a third example according to an embodiment of the present disclosure.

FIG. 24 shows a control block diagram of this example. When the main unit is in a power-off state, the auxiliary processor can independently control and detect the touchscreen unit, compute an electrical signal generated by the sensing of the touchscreen, and make a judgment; and trigger a power-on operation of the main unit when the power-on conditions are met, as detailed below:

1. The auxiliary processor determines the status of the main unit based on a main unit status signal. When detecting that the main unit is in a power-off state for a preset duration T0, the auxiliary processor controls the light-emitting unit to emit light, indicates the power-on region to the user, and at the same time, scans the power-on indication region by using the touchscreen unit to detect the user's touch operation.

Alternatively, the auxiliary processor receives a power-off command of the main unit through a communication interface between the main unit and the auxiliary processor. Upon expiration of a preset duration T1 (T1 is greater than, and may be determined based on, a total power-off duration) after receiving the power-off command, the auxiliary processor controls the light-emitting unit to emit light, indicates the power-on region to the user, and at the same time, scans the power-on indication region by using the touchscreen unit to detect the user's touch operation.

Figure 25:
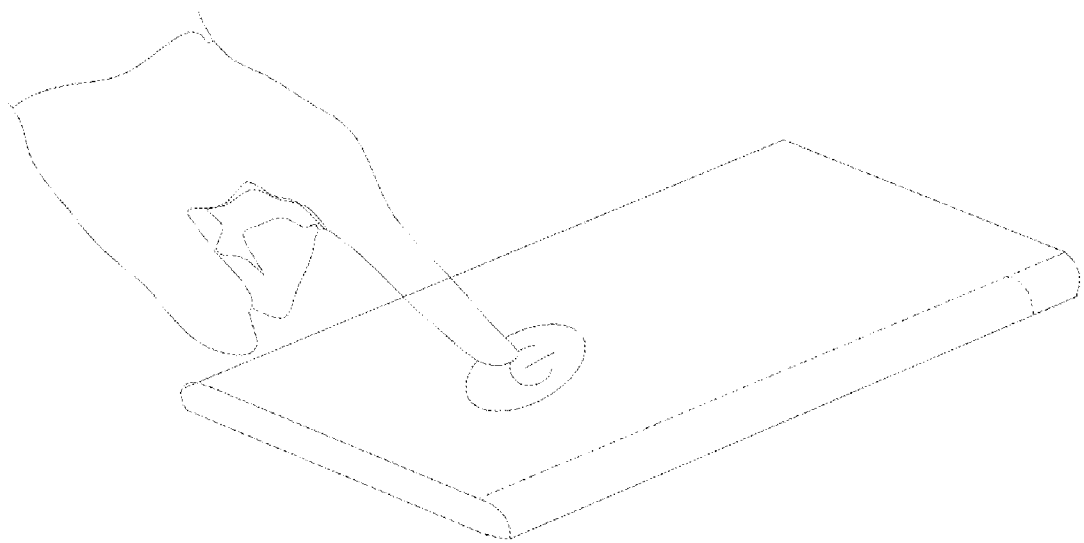
FIG. 25 is a schematic diagram of a user's finger touching a power-on indication region according to an embodiment of the present disclosure.
Figure 26:
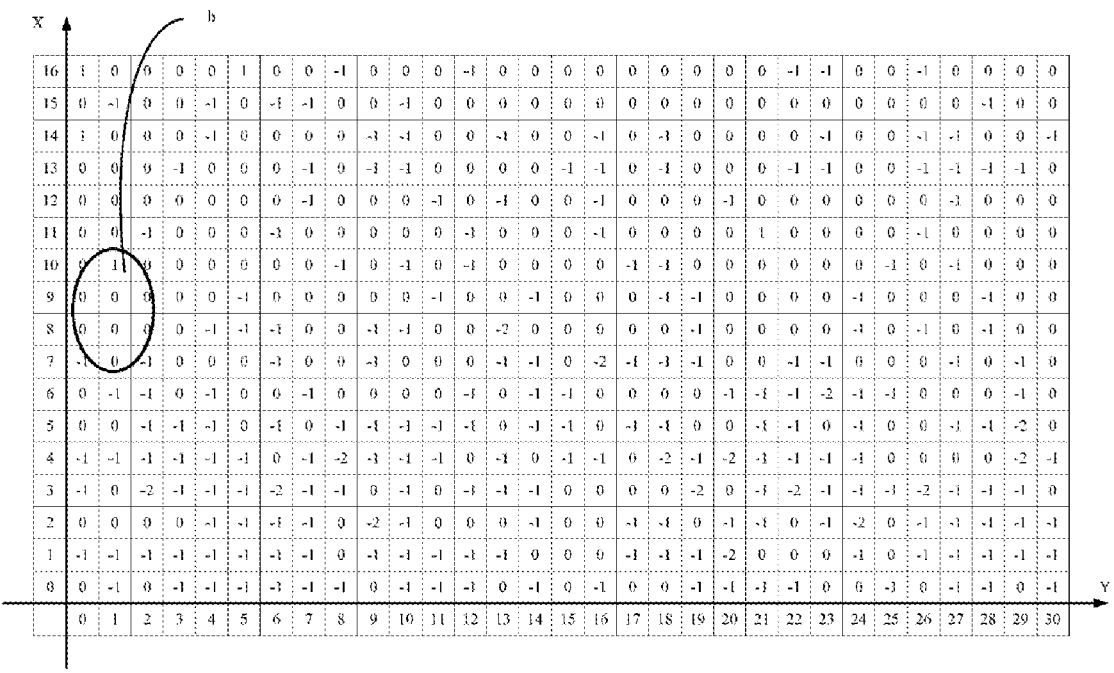
FIG. 26 is a schematic diagram of a correspondence between a position of a sensing unit and a power-on indication region according to an embodiment of the present disclosure.

2. When the user's finger touches the power-on indication region (as shown in FIG. 25), the touch leads to change of capacitance values of sensing units in this region or on the periphery. The touchscreen unit converts a capacitance variation into an electrical signal. Alternatively, FIG. 26 is a schematic diagram of a correspondence between the position of the sensing unit and the power-on indication region (in which h represents the power-on indication region).

The touchscreen unit or the auxiliary processor calculates and processes capacitance variations of all sensing units in the power-on indication region.

The position of the sensing unit corresponds to the power-on indication region.

For example, if the power-on indication region corresponds to 9 sensing units, a weighted sum operation is performed on the capacitance values sensed by the 9 sensing units:

(X7, Y0), (X8, Y0), (X9, Y0)
(X7, Y1), (X8, Y1), (X9, Y1)
(X7, Y2), (X8, Y2), (X9, Y2)

3. When the weighted sum of the capacitance values exceeds a preset threshold CO for a duration longer than a preset time T3, it is determined that the user performs a power-on operation; and the auxiliary processor sends a signal to the main unit to power on.

It is to be noted that the above algorithm rules are merely intended to illustrate this method. In practical applications, different algorithm rules may be set depending on the touch effect.

The remaining control processes of this example are the same as those of Example I except the conditions for determining whether to power on, details of which are omitted herein.

As can be seen from above, the solution in this example does not require an additional pressure sensor, but reuses the touchscreen unit when the main unit is in the power-off state, and is easy to implement. Other advantages over existing solutions are the same as those described in Example I, and are omitted herein.

Example IV

Figure 27:
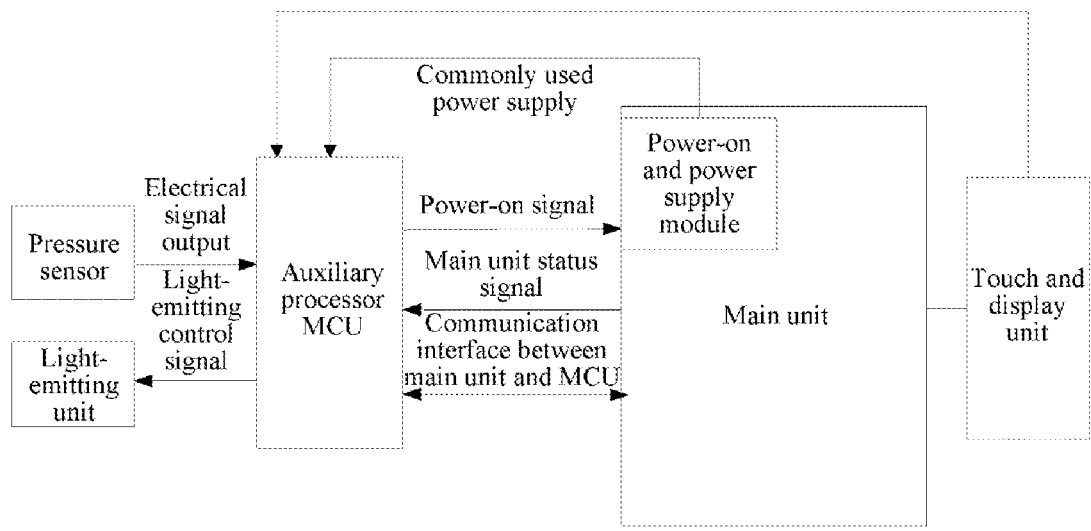
FIG. 27 is a block diagram of system control in a fourth example according to an embodiment of the present disclosure.

The power-on detection unit in this example is constructed from the pressure sensor in Example I and the touchscreen unit in Example III. When determining that both the pressing operation and the touch operation of the user in the power-on indication region meet the power-on conditions, the auxiliary processor sends a signal to the main unit to power on. FIG. 27 shows a system control block diagram.

In this example, the main unit is not powered on until both the touch operation and the pressure of the user are detected, thereby effectively preventing a turn-on event from being triggered by mistake, where the mistaken triggering arises when the pressure is not caused by the pressing of the finger or is not exerted on the power-on indication region (preventing the mistaken touch caused when just pressure is exerted on the power-on indication region but the regions in the proximity are deformed), or when the finger touches the region by mistake (the pressure is insufficient). Other advantages over existing solutions are the same as those described in Example I and Example III, and are omitted herein.

It is to be noted that the key structure according to this embodiment of the present disclosure is applicable to not only a power-on key reflecting the power-on function, but also other keys such as a hidden artificial intelligence (Artificial Intelligence, AI) key under the OLED screen and volume up and down keys, without being limited herein.

The under-screen hidden key according to this embodiment of the present disclosure may also serve as a screen-on key of a mobile terminal with screen turned off. The light-emitting unit may also be reused as a mobile terminal indicator (to indicate incoming messages or remaining battery power or the like). The indication may be implemented by displaying different patterns.

The electronic device in this embodiment of the present disclosure is implemented in the form not limited to a mobile terminal, but may be implemented in the form of other devices such as a wearable device or a tablet computer, without being limited herein.

Figure 28:
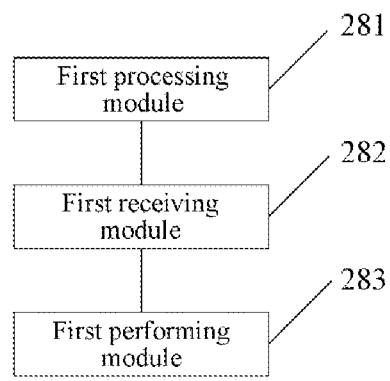
FIG. 28 is a first schematic structural diagram of an electronic device according to an embodiment of the present disclosure.

An embodiment of the present disclosure further provides an electronic device. The electronic device includes the key structure described above. As shown in FIG. 28, the electronic device further includes:

- a first processing module 281, configured to turn on the light-emitting unit based on first preset information, where the light emitted by the light-emitting unit forms the preset key pattern on the OLED screen;
- a first receiving module 282, configured to receive a touch operation specific to the preset key pattern by using the sensing unit; and
- a first performing module 283, configured to perform a preset operation in response to the touch operation, The first preset information includes first indication information corresponding to a key structure, and/or, the first preset information includes first time information for controlling the light-emitting unit to emit light.

The electronic device according to this embodiment of the present disclosure turns on the light-emitting unit based on the first preset information, where the light emitted by the light-emitting unit forms the preset key pattern on the OLED screen; receives a touch operation specific to the preset key pattern by using the sensing unit; and performs a preset operation in response to the touch operation, where the first preset information includes the first indication information corresponding to the key structure, and/or, the first preset information includes the first time information for controlling the light-emitting unit to emit light. This embodiment of the present disclosure can implement a key-pressing function of the key structure disposed inside the electronic device, and prevent the key structure from occupying an external arrangement region of the electronic device and from affecting the increase of the screen-to-body ratio, thereby appropriately solving the problem that the key disposed on the electronic device in the prior art affects the increase of the screen-to-body ratio.

The first time information includes at least one of the following information: first information for controlling, in a case that the electronic device is in a screen-off state for a first duration, the light-emitting unit to continuously emit light for a second duration; or second information for controlling, in a case that the electronic device is in the screen-off state for a third duration, the light-emitting unit to intermittently emit light for a fourth duration.

In this embodiment of the present disclosure, touch modes of the touch operation include at least two touch modes, and the preset operation includes at least two target operations. Each touch mode corresponds to one of the target operations.

Similarly, the touch modes of the touch operation include at least two touch modes, the first time information includes at least two types of time information. Each touch mode corresponds to one type of the time information.

Alternatively, the preset operation includes at least two target operations, and the first time information includes a plurality of pieces of first time sub-information. Each different target operation corresponds to a different piece of the first time sub-information.

In this embodiment of the present disclosure, the light emitted by the light-emitting unit forms at least two preset key patterns on the OLED screen. Each different preset key pattern corresponds to a first trigger operation that generates different first indication information; or the first time information includes a plurality of pieces of second time sub-information, and each different piece of second time sub-information corresponds to a different preset key pattern.

The first processing module includes: a first obtaining submodule, configured to obtain a light-emitting parameter specific to the preset key pattern based on the first preset information; and a first processing submodule, configured to turn on the light-emitting unit based on the light-emitting parameter, where the light-emitting parameter includes at least one of light-emitting color, light-emitting intensity, light-emitting frequency, or light-emitting duration.

Further, the electronic device further includes: a second processing module, configured to change, before the preset operation is performed in response to the touch operation, a light-emitting parameter of the light-emitting unit in a case that the touch operation specific to the preset key pattern is received by using the sensing unit, where the light-emitting parameter includes at least one of light-emitting color, light-emitting intensity, light-emitting frequency, or light-emitting duration.

Still further, the electronic device further includes: a first control module, configured to control, before the preset operation is performed in response to the touch operation and after the touch operation specific to the preset key pattern is received by using the sensing unit, the electronic device to vibrate based on a first preset rule.

In this embodiment of the present disclosure, the electronic device further includes: a third processing module, configured to turn off, after the preset operation is performed in response to the touch operation, the light-emitting unit based on second preset information, where the second preset information includes second indication information corresponding to the key structure, and/or, the second preset information includes second time information for controlling the light-emitting unit to be turned off.

The second time information includes at least one of the following information: third information for controlling, in a case that the electronic device is in a powered-on screen-on state for a fifth duration, the light-emitting unit to continuously turn off for a sixth duration; or fourth information for controlling, in a case that the electronic device is in the powered-on screen-on state for a seventh duration, the light-emitting unit to intermittently turn off for an eighth duration.

Alternatively, the light emitted by the light-emitting unit forms at least two preset key patterns on the OLED screen. Each different preset key pattern corresponds to a second trigger operation that generates different second indication information; or the second time information includes a plurality of pieces of third time sub-information, and each different piece of third time sub-information corresponds to a different preset key pattern.

In this embodiment of the present disclosure, in a case that the sensing unit includes a pressure sensing unit, the receiving a touch operation specific to the preset key pattern by using a sensing unit, and performing a preset operation in response to the touch operation, include: receiving first pressure information by using the pressure sensing unit; determining pressure gradient information based on the first pressure information; determining, based on the pressure gradient information, pressure center position information corresponding to the first pressure information; and performing the preset operation in response to the touch operation in a case that the pressure center position information matches position information of the preset key pattern.

The electronic device according to this embodiment of the present disclosure can implement all processes implemented by the electronic device described in the relevant embodiments shown in FIG. 2 to FIG. 27, details of which are omitted here for brevity.

Figure 29:
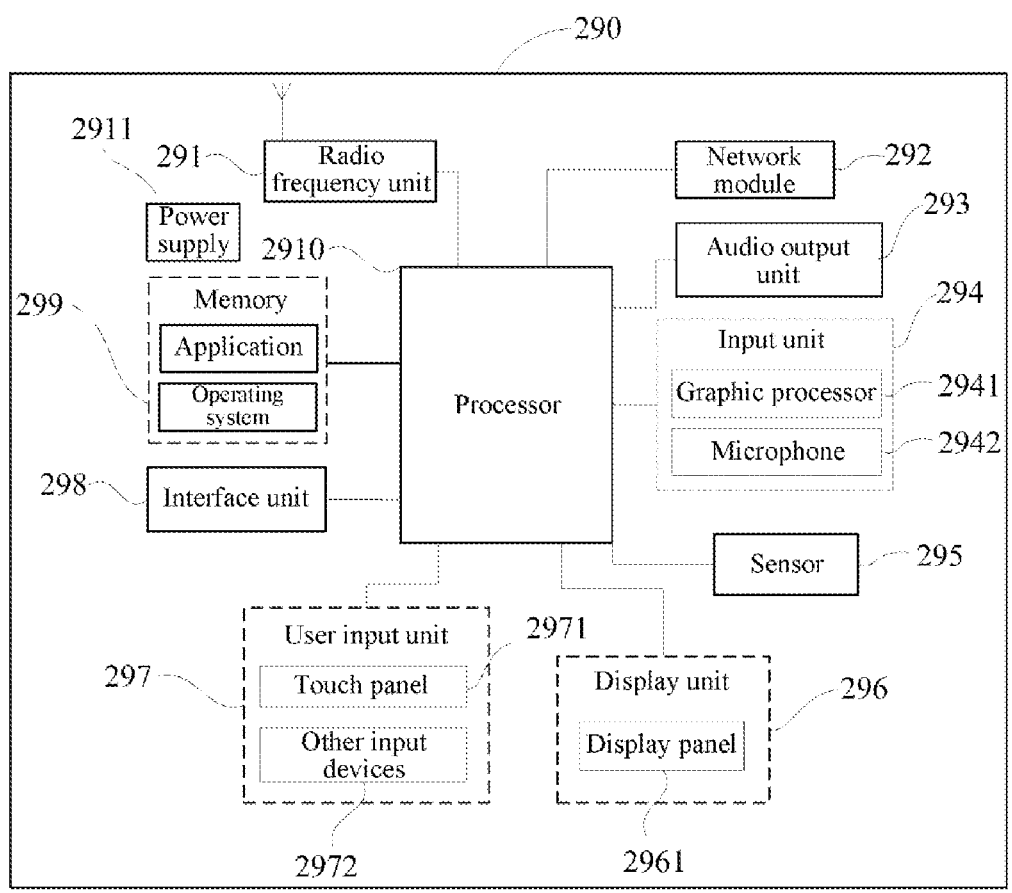
FIG. 29 is a second schematic structural diagram of an electronic device according to an embodiment of the present disclosure.

FIG. 29 is a schematic structural diagram of hardware of an electronic device configured to implement embodiments of the present disclosure. An electronic device 290 includes, but is not limited to, components such as a radio frequency unit 291, a network module 292, an audio output unit 293, an input unit 294, a sensor 295, a display unit 296, a user input unit 297, an interface unit 298, a memory 299, a processor 2910, and a power supply 2911. A person skilled in the art may understand that the structure of the electronic device shown in FIG. 29 constitutes no limitation on the electronic device, and the electronic device may include more or fewer components than those shown in the figure, or some components may be combined, or a different component deployment may be used. In the embodiments of the present disclosure, the electronic device includes, but is not limited to, a mobile phone, a tablet computer, a notebook computer, a palmtop computer, an in-vehicle terminal, a wearable device, a pedometer, and the like.

The electronic device includes the foregoing key structure. The processor 2910 is configured to: turn on the light-emitting unit based on first preset information, where the light emitted by the light-emitting unit forms the preset key pattern on the OLED screen; receive a touch operation specific to the preset key pattern by using the sensing unit; and perform a preset operation in response to the touch operation, where, the first preset information includes first indication information corresponding to the key structure, and/or, the first preset information includes first time information for controlling the light-emitting unit to emit light.

In the embodiments of the present disclosure, the light-emitting unit is turned on based on first preset information, where the light emitted by the light-emitting unit forms the preset key pattern on the OLED screen; a touch operation specific to the preset key pattern is received by using the sensing unit; and a preset operation is performed in response to the touch operation, where, the first preset information includes first indication information corresponding to the key structure, and/or, the first preset information includes first time information for controlling the light-emitting unit to emit light. This embodiment of the present disclosure can implement a key-pressing function of the key structure disposed inside the electronic device, and prevent the key structure from occupying an external arrangement region of the electronic device and from affecting the increase of the screen-to-body ratio, thereby appropriately solving the problem that the key disposed on the electronic device in the prior art affects the increase of the screen-to-body ratio.

Optionally, the first time information includes at least one of the following information: first information for controlling, in a case that the electronic device is in a screen-off state for a first duration, the light-emitting unit to continuously emit light for a second duration; or second information for controlling, in a case that the electronic device is in the screen-off state for a third duration, the light-emitting unit to intermittently emit light for a fourth duration.

Optionally, touch modes of the touch operation include at least two touch modes, and the preset operation includes at least two target operations, where, each touch mode corresponds to one of the target operations.

Optionally, the touch modes of the touch operation include at least two touch modes, the first time information includes at least two types of time information. Each touch mode corresponds to one type of the time information.

Optionally, the preset operation includes at least two target operations, and the first time information includes a plurality of pieces of first time sub-information. Each different target operation corresponds to a different piece of the first time sub-information.

Optionally, the light emitted by the light-emitting unit forms at least two preset key patterns on the OLED screen; each different preset key pattern corresponds to a first trigger operation that generates different first indication information; or the first time information includes a plurality of pieces of second time sub-information, and each different piece of second time sub-information corresponds to a different preset key pattern.

Optionally, the processor 2910 is configured to: obtain a light-emitting parameter specific to the preset key pattern based on the first preset information; and turn on the light-emitting unit based on the light-emitting parameter, where, the light-emitting parameter includes at least one of light-emitting color, light-emitting intensity, light-emitting frequency, or light-emitting duration.

Optionally, the processor 2910 is further configured to: change, before the preset operation is performed in response to the touch operation, a light-emitting parameter of the light-emitting unit in a case that the touch operation specific to the preset key pattern is received by using the sensing unit, where, the light-emitting parameter includes at least one of light-emitting color, light-emitting intensity, light-emitting frequency, or light-emitting duration.

Optionally, the processor 2910 is further configured to: control, before the preset operation is performed in response to the touch operation and after the touch operation specific to the preset key pattern is received by using the sensing unit, the electronic device to vibrate based on a first preset rule.

Optionally, the processor 2910 is further configured to: turn off the light-emitting unit based on second preset information after the preset operation is performed in response to the touch operation, where, the second preset information includes second indication information corresponding to the key structure, and/or, the second preset information includes second time information for controlling the light-emitting unit to be turned off.

Optionally, the second time information includes at least one of the following information: third information for controlling, in a case that the electronic device is in a powered-on screen-on state for a fifth duration, the light-emitting unit to continuously turn off for a sixth duration; or fourth information for controlling, in a case that the electronic device is in the powered-on screen-on state for a seventh duration, the light-emitting unit to intermittently turn off for an eighth duration.

Optionally, the light emitted by the light-emitting unit forms at least two preset key patterns on the OLED screen; each different preset key pattern corresponds to a second trigger operation that generates different second indication information; or the second time information includes a plurality of pieces of third time sub-information, and each different piece of third time sub-information corresponds to a different preset key pattern.

Optionally, in a case that the sensing unit includes a pressure sensing unit, the processor 2910 is configured to: receive first pressure information by using the pressure sensing unit; determine pressure gradient information based on the first pressure information; determine, based on the pressure gradient information, pressure center position information corresponding to the first pressure information; and perform the preset operation in response to the touch operation in a case that the pressure center position information matches position information of the preset key pattern.

It is to be understood that, in this embodiment of the present disclosure, the radio frequency unit 291 may be configured to receive and transmit information or receive and transmit a signal during a call. To be specific, the radio frequency unit 291 is configured to receive downlink data from a base station and transmit the downlink data to the processor 2910 for processing; and transmit uplink data to the base station. Generally, the radio frequency unit 291 includes, but is not limited to, an antenna, at least one amplifier, a transceiver, a coupler, a low noise amplifier, a duplexer, and the like. In addition, the radio frequency unit 291 may further communicate with another device through a wireless communication system and network.

The electronic device provides wireless broadband Internet access for a user by using the network module 292, for example, allowing the user to receive and send emails, browse webpages, access streaming media content, and so on.

The audio output unit 293 may convert audio data received by the radio frequency unit 291 or the network module 292 or stored on the memory 299 into audio signals and output the audio signals as sounds. In addition, the audio output unit 293 may further provide audio output related to specific functions implemented by the electronic device 290 (for example, a call signal receiving sound and a message receiving sound). The audio output unit 293 includes a speaker, a buzzer, a receiver, and the like.

The input unit 294 is configured to receive an audio or video signal. The input unit 294 may include a graphics processing unit (Graphics Processing Unit, GPU) 2941 and a microphone 2942. The graphics processing unit 2941 processes image data of a static picture or a video acquired by an image capturing device (for example, a camera) in a video capturing mode or an image capturing mode. The processed image frame can be displayed on the display unit 296. The image frame processed by the graphics processing unit 2941 may be stored on the memory 299 (or another storage medium) or transmitted through the radio frequency unit 291 or the network module 292. The microphone 2942 can receive sounds and can process such sounds as audio data. The processed audio data can be converted a phone call mode into an output in a format that can be transmitted by the radio frequency unit 291 to a mobile communication base station.

The electronic device 290 further includes at least one sensor 295 such as an optical sensor, a motion sensor, or another sensor. Alternatively, the optical sensor includes an ambient light sensor and a proximity sensor. The ambient light sensor may adjust luminance of a display panel 2961 according to brightness of the ambient light. The proximity sensor may switch off the display panel 2961 and/or backlight when the electronic device 290 is moved to the ear. As one type of motion sensor, an accelerometer sensor can detect magnitudes of accelerations in various directions (generally, on three axes), may detect a magnitude and a direction of the gravity when static, and may be applied to recognizing the attitude of the electronic device (for example, switching between landscape orientation and portrait orientation, a related game, and magnetometer attitude calibration), a function related to vibration recognition (such as a pedometer and a knock), and the like. The sensor 295 may further include a fingerprint sensor, a pressure sensor, an iris sensor, a molecular sensor, a gyroscope, a barometer, a hygrometer, a thermometer, an infrared sensor, and the like, which are not described herein in detail.

The display unit 296 is configured to display information inputted by the user or information provided for the user. The display unit 296 may include a display panel 2961. The display panel 2961 may be configured in the form of a liquid crystal display (Liquid Crystal Display, LCD), an organic light-emitting diode (Organic Light-Emitting Diode, OLED), or the like.

The user input unit 297 may be configured to receive input digit or character information, and generate a keyboard signal input related to the user setting and function control of the electronic device. Alternatively, the user input unit 297 includes a touch panel 2971 and another input device 2972. The touch panel 2971, also referred to as a touchscreen, may collect a touch operation of a user on or near the touch panel (such as an operation of a user on or near the touch panel 2971 by using any suitable object or attachment, such as a finger or a stylus). The touch panel 2971 may include two parts: a touch detection apparatus and a touch controller. The touch detection apparatus detects a touch position of the user, detects a signal generated by the touch operation, and transfers the signal to the touch controller. The touch controller receives touch information from the touch detection apparatus, converts the touch information into touch point coordinates, and transmits the touch point coordinates to the processor 2910. In addition, the touch controller receives a command transmitted by the processor 2910 and executes the command. In addition, the touch panel 2971 may be implemented by using various types, such as a resistive type, a capacitive type, an infrared type, and a surface acoustic wave type. In addition to the touch panel 2971, the user input unit 297 may further include the another input device 2972. Alternatively, the another input device 2972 may include, but not limited to, a physical keyboard, a functional key (such as a volume control key or a switch key), a track ball, a mouse, and a joystick, which are not described herein in detail.

Further, the touch panel 2971 may cover the display panel 2961. After detecting a touch operation on or near the touch panel, the touch panel 2971 transfers the touch operation to the processor 2910, to determine a type of a touch event. Then, the processor 2910 provides a corresponding visual output on the display panel 2961 according to the type of the touch event. In FIG. 29, the touch panel 2971 and the display panel 2961 implement, as two independent parts, input and output functions of the electronic device. However, in some embodiments, the touch panel 2971 and the display panel 2961 may be integrated to implement the input and output functions of the electronic device. The details are not limited herein.

The interface unit 298 is an interface for connecting an external apparatus and the electronic device 290. For example, the external apparatus may include a wired or wireless headset port, an external power supply (or battery charger) port, a wired or wireless data port, a memory card port, a port for connecting an apparatus with a recognition module, an audio input/output (Input/Output, I/O) port, a video I/O port, a headphone port, and the like. The interface unit 298 may be configured to receive input (for example, data information or power) from an external apparatus and transmit the received input to one or more elements in the electronic device 290 or may be configured to transmit data between the electronic device 290 and the external apparatus.

The memory 299 may be configured to store a software program and various data. The memory 299 may mainly include a program storage area and a data storage area. The program storage area may store an operating system, an application program required by at least one function (for example, a sound playback function and an image display function), and the like. The data storage area may store data (for example, audio data and an address book) created according to the use of the mobile phone, and the like. In addition, the memory 299 may include a high speed random access memory, and may further include a non-volatile memory, such as at least one magnetic disk storage device, a flash memory, or another volatile solid storage device.

The processor 2910 is a control center of the electronic device, and connects to various parts of the electronic device by using various interfaces and lines. By running or executing the software program and/or module stored in the memory 299, and invoking data stored in the memory 299, the processor performs various functions and data processing of the electronic device, thereby performing overall monitoring on the electronic device. The processor 2910 may include one or more processing units. Alternatively, the processor 2910 may integrate an application processor and a modem processor. The application processor mainly processes an operating system, a user interface, an application program, and the like. The modem processor mainly processes wireless communication. It may be understood that the modem processor may either not be integrated into the processor 2910.

The electronic device 290 may further include the power supply 2911 (such as a battery) for supplying power to the components. Alternatively, the power supply 2911 may be logically connected to the processor 2910 by a power management system, thereby implementing functions such as charging, discharging, and power consumption management by using the power management system.

In addition, the electronic device 290 includes some functional module that are not shown, which are not described herein in detail.

Alternatively, an embodiment of the present disclosure further provides an electronic device, including a processor 2910, a memory 299, and a computer program on the memory 299 and executed on the processor 2910, where when executed by the processor 2910, the computer program implements the processes of the embodiment of the key control method mentioned above, and can achieve the same technical effects. To avoid repetition, details are not described herein again.

An embodiment of the present disclosure further provides a computer-readable storage medium, storing a computer program, where the computer program, when executed by a processor, implements various processes of the embodiments of the processes of the embodiment of the key control method mentioned above, and can achieve the same technical effects. To avoid repetition, details are not described herein again. The computer-readable storage medium is, for example, a read-only memory (Read-Only Memory, ROM), a random access memory (Random Access Memory, RAM), a magnetic disk, an optical disc, or the like.

An embodiment of the present disclosure further provides a chip. The chip includes a processor and a communication interface. The communication interface is coupled to the processor. The processor is configured to run a program or instructions to implement all embodiments of the key control method described above, and the same technical effects can be achieved, which will not be described in detail herein again to avoid repetition. Further, the chip may further include a memory. The memory is connected to the processor and is configured to store the program or instructions run on the processor.

It should be noted that, the term "include," "comprise," or any other variation thereof in this specification is intended to cover a non-exclusive inclusion, which specifies the presence of stated processes, methods, objects, or apparatuses, but does not preclude the presence or addition of one or more other processes, methods, objects, or apparatuses. Unless otherwise specified, elements defined by the sentence "including one" does not exclude that there are still other same elements in the processes, methods, objects, or apparatuses.

Through the foregoing description on the implementations, a person skilled in the art can clearly learn that the foregoing embodiment methods may be implemented by using software in combination with a necessary universal hardware platform. Certainly, the embodiment methods may also be implemented by using hardware, but the former is a better implementation in many cases. Based on such an understanding, the technical solutions of the present disclosure essentially or the part contributing to the prior art may be implemented in a form of a software product. The computer software product is stored in a storage medium (such as a ROM/RAM, a magnetic disk, or an optical disc) and includes several instructions for instructing an electronic device (which may be a mobile phone, a computer, a server, an air conditioner, a network device, or the like) to perform the methods described in the embodiments of the present disclosure. The computer software product may include a computer program product.

A person of ordinary skill in the art may notice that the exemplary units and algorithm steps described with reference to the embodiments disclosed in this specification can be implemented in electronic hardware, or a combination of computer software and electronic hardware. Whether the functions are executed in a mode of hardware or software depends on particular applications and design constraint conditions of the technical solutions. A person skilled in the art may use different methods to implement the described functions for each particular application, but such implementation is not to be considered beyond the scope of the present disclosure.

A person skilled in the art may clearly understand that for convenience and conciseness of description, for specific working processes of the foregoing systems, apparatuses and units, reference may be made to the corresponding processes in the foregoing method embodiments, and details are not described herein again.

In the embodiments provided in this application, it is to be understood that the disclosed apparatus and method may be implemented in other manners. For example, the described apparatus embodiment is merely an example. For example, the unit division is merely logical function division and may be other division during actual implementation. For example, a plurality of units or components may be combined or integrated into another system, or some features may be omitted or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to an actual requirement to achieve the objectives of the solutions in the embodiments.

In addition, functional units in the embodiments of the present disclosure may be integrated into one processing unit, or each of the units may be physically separated, or two or more units may be integrated into one unit.

A person of ordinary skill in the art may understand that all or some of the processes of the methods in the embodiments may be implemented by a computer program controlling relevant hardware. The program may be stored in a computer-readable storage medium. When the program is executed, the procedures of the foregoing method embodiments may be performed. The foregoing storage medium may include a magnetic disc, an optical disc, a read-only memory (Read-Only Memory, ROM), a random access memory (Random Access Memory, RAM), or the like.

It may be understood that, the embodiments described in the embodiments of the present disclosure may be implemented by using software, hardware, firmware, middleware, microcode, or a combination thereof. For hardware implementation, the processing unit may be implemented by one or more application-specific integrated circuits (Application Specific Integrated Circuits, ASICASICs), digital signal processors (Digital Signal Processing, DSPDSPs), digital signal processor devices (DSP Device, DSPDDSPDs), programmable logic devices (PLDs), field programmable gate arrays (Field-Programmable Gate Array, FPGAFPGAs), general-purpose processors, controllers, microcontrollers, microprocessors, other electronic components configured to implement the functions of the present disclosure, or a combination thereof.

For software implementation, the technology described in the embodiments of the present disclosure may be implemented by using modules (for example, processes and functions) implementing the functions of the embodiments of the present disclosure. Software code may be stored in a memory and executed by a processor. The memory may be implemented inside or outside the processor.

The embodiments of the present disclosure have been described above with reference to the accompanying drawings. The present disclosure is not limited to the specific embodiments described above, and the specific embodiments described above are merely exemplary and not limitative. A person of ordinary skill in the art may make various variations under the enlightenment of the present disclosure without departing from the spirit of the present disclosure and the protection scope of the claims, and such variations shall all fall within the protection scope of the present disclosure.

What is claimed is:

1. A key structure, applied to an electronic device, wherein the electronic device comprises an organic light-emitting diode (OLED) screen and an under-screen unit disposed on a first side of the OLED screen, a through-hole is provided at a preset position of the under-screen unit, and the key structure comprises:
   a light-shielding unit, disposed on a side of the under-screen unit that faces back from the OLED screen, wherein the light shielding unit is fixedly connected to the under-screen unit at the through hole, wherein the light shielding unit contains an accommodation space;
   a light-emitting unit, disposed in the accommodation space;
   an optical unit, disposed in the accommodation space, and located between the OLED screen and the light-emitting unit, wherein light emitted by the light-emitting unit forms a preset key pattern on the OLED screen after passing through the optical unit; and
   a sensing unit, located on one side of the light-shielding unit.

2. The key structure according to claim 1, wherein the sensing unit comprises at least one of a first sensing subunit, a second sensing subunit, or a third sensing subunit, the first sensing subunit is disposed on one side of the through-hole, the second sensing subunit is disposed in a preset region on a second side of the OLED screen, the third sensing subunit is disposed in the accommodation space, and the third sensing subunit is located between the light-emitting unit and the light-shielding unit; and
   the second side is disposed opposite to the first side, and the preset region comprises a region for displaying the preset key pattern on the OLED screen.

3. The key structure according to claim 2, wherein the first sensing subunit is a pressure sensing unit; and/or
   the second sensing subunit is a fingerprint sensing unit; and/or
   the third sensing subunit is an optical sensing unit.

4. The key structure according to claim 1, wherein the optical unit comprises at least one of a lens structure, a pinhole imaging structure, or a pattern layer disposed on the first side of the OLED screen.

5. The key structure according to claim 1, wherein the OLED screen is a curved screen, the curved screen comprises a first display region and a curved display region, and the light-emitting unit, the light-shielding unit, the optical unit, and the sensing unit are all disposed on one side of the curved screen and are opposite to the curved display region.

6. A key control method, applied to an electronic device, the control method comprising:
   turning on a light-emitting unit based on first preset information, wherein the light emitted by the light-emitting unit forms a preset key pattern on an organic light-emitting diode (OLED) screen;
   receiving a touch operation specific to the preset key pattern by using a sensing unit; and
   performing a preset operation in response to the touch operation,
   wherein, the first preset information comprises first indication information corresponding to a key structure, and/or, the first preset information comprises first time information for controlling the light-emitting unit to emit light.

7. The control method according to claim 6, wherein the first time information comprises at least one of the following information:
   first information for controlling, in a case that the electronic device is in a screen-off state for a first duration, the light-emitting unit to continuously emit light for a second duration; or
   second information for controlling, in a case that the electronic device is in the screen-off state for a third duration, the light-emitting unit to intermittently emit light for a fourth duration.

8. The control method according to claim 6, wherein touch modes of the touch operation comprise at least two touch modes, and the preset operation comprises at least two target operations,
   wherein, each touch mode corresponds to one of the target operations.

9. The control method according to claim 6, wherein touch modes of the touch operation comprise at least two touch modes, the first time information comprises at least two types of time information, and each touch mode corresponds to one type of the time information.

10. The control method according to claim 6, wherein the preset operation comprises at least two target operations, the first time information comprises a plurality of pieces of first time sub-information, and each different target operation corresponds to a different piece of the first time sub-information.

11. The control method according to claim 6, wherein the light emitted by the light-emitting unit forms at least two preset key patterns on the OLED screen;
   each different preset key pattern corresponds to a first trigger operation that generates different first indication information; or
   the first time information comprises a plurality of pieces of second time sub-information, and each different piece of second time sub-information corresponds to a different preset key pattern.

12. The control method according to claim 6, wherein the turning on the light-emitting unit based on first preset information comprises:
   obtaining a light-emitting parameter specific to the preset key pattern based on the first preset information; and
   turning on the light-emitting unit based on the light-emitting parameter,
   wherein, the light-emitting parameter comprises at least one of light-emitting color, light-emitting intensity, light-emitting frequency, or light-emitting duration.

13. The control method according to claim 6, wherein before the performing a preset operation in response to the touch operation, the control method further comprises:
   changing a light-emitting parameter of the light-emitting unit in a case that the touch operation specific to the preset key pattern is received by using the sensing unit,
   wherein, the light-emitting parameter comprises at least one of light-emitting color, light-emitting intensity, light-emitting frequency, or light-emitting duration.

14. The control method according to claim 6, wherein before the performing a preset operation in response to the touch operation, the control method further comprises:
   controlling, after the touch operation specific to the preset key pattern is received by using the sensing unit, the electronic device to vibrate based on a first preset rule.

15. The control method according to claim 6, wherein after the performing a preset operation in response to the touch operation, the control method further comprises:
   turning off the light-emitting unit based on second preset information,
   wherein, the second preset information comprises second indication information corresponding to the key structure, and/or, the second preset information comprises second time information for controlling the light-emitting unit to be turned off.

16. The control method according to claim 15, wherein the second time information comprises at least one of the following information:
   third information for controlling, in a case that the electronic device is in a powered-on screen-on state for a fifth duration, the light-emitting unit to continuously turn off for a sixth duration; or
   fourth information for controlling, in a case that the electronic device is in the powered-on screen-on state for a seventh duration, the light-emitting unit to intermittently turn off for an eighth duration.

17. The control method according to claim 15, wherein the light emitted by the light-emitting unit forms at least two preset key patterns on the OLED screen;
   each different preset key pattern corresponds to a second trigger operation that generates different second indication information; or
   the second time information comprises a plurality of pieces of third time sub-information, and each different piece of third time sub-information corresponds to a different preset key pattern.

18. The control method according to claim 6, wherein in a case that the sensing unit comprises a pressure sensing unit, the receiving a touch operation specific to the preset key pattern by using the sensing unit, and performing a preset operation in response to the touch operation, comprise:
   receiving first pressure information by using the pressure sensing unit;
   determining pressure gradient information based on the first pressure information;
   determining, based on the pressure gradient information, pressure center position information corresponding to the first pressure information; and
   performing the preset operation in response to the touch operation in a case that the pressure center position information matches position information of the preset key pattern.

19. A non-transitory computer-readable storage medium, storing a computer program, the computer program, when executed by a processor, implementing the following:
   turning on a light-emitting unit based on first preset information, wherein the light emitted by the light-emitting unit forms a preset key pattern on an organic light-emitting diode (OLED) screen;
   receiving a touch operation specific to the preset key pattern by using a sensing unit; and
   performing a preset operation in response to the touch operation,
   wherein, the first preset information comprises first indication information corresponding to a key structure, and/or, the first preset information comprises first time information for controlling the light-emitting unit to emit light.

20. The non-transitory computer-readable storage medium according to claim 19, wherein the first time information comprises at least one of the following information:
   first information for controlling, in a case that an electronic device is in a screen-off state for a first duration, the light-emitting unit to continuously emit light for a second duration; or
   second information for controlling, in a case that the electronic device is in the screen-off state for a third duration, the light-emitting unit to intermittently emit light for a fourth duration.

* * * * *